(12) United States Patent
Tajima et al.

(10) Patent No.: US 6,407,796 B2
(45) Date of Patent: Jun. 18, 2002

(54) TAPE CARRIER PACKAGE AND DISPLAY DEVICE USING THE SAME

(75) Inventors: Naoyuki Tajima, Yamatotakada; Yasunori Chikawa, Kitakatsuragi-gun; Shunichi Murahashi, Nabari; Seijirou Gyouten, Tenri, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/873,393

(22) Filed: Jun. 5, 2001

Related U.S. Application Data

(63) Continuation of application No. 08/972,014, filed on Nov. 17, 1997, now abandoned.

(30) Foreign Application Priority Data

Nov. 29, 1996 (JP) ............................................. 8-320174
Jun. 26, 1997 (JP) ............................................. 9-170774

(51) Int. Cl.[7] ........................................... G02F 1/1345
(52) U.S. Cl. ....................................... 349/150; 361/749
(58) Field of Search ................................. 349/149, 150, 349/151, 152; 361/749; 174/254

(56) References Cited

FOREIGN PATENT DOCUMENTS

JP          06-202132          * 7/1994

* cited by examiner

*Primary Examiner*—Kenneth Parker
(74) *Attorney, Agent, or Firm*—Nixon & Vanderhye P.C.

(57) ABSTRACT

A tape carrier package is provided, which includes: a line provided on one surface of a tape substrate; and a semiconductor chip mounted on an other surface of the tape substrate, the semiconductor chip having an electrode which is electrically connected to the line. The line extends from one end to an opposite end of the tape substrate and includes a connection where an intermediate line portion provided in a middle between the ends is electrically connected to the electrode.

21 Claims, 27 Drawing Sheets

Cross-sectional view along A-A(Figure 3)
(Sealing resin is not shown)

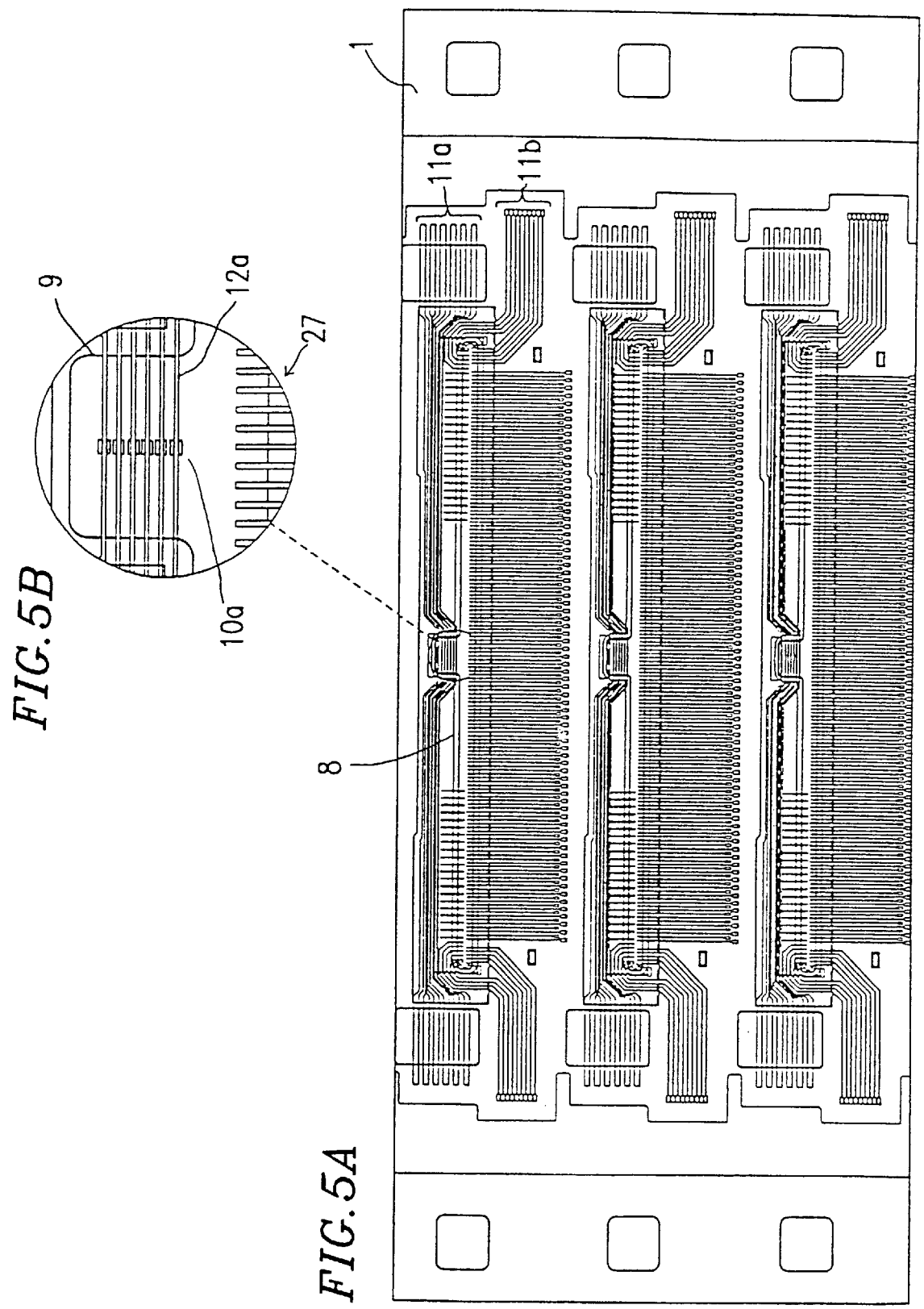

Input buffer circuit

Output buffer circuit

TAPE CARRIER PACKAGE AND DISPLAY DEVICE USING THE SAME

This application is a continuation of application Ser. No. 08/972,014 filed Nov. 17, 1997 now abandonded.

BACKGROUND OF THE INVENTION

1. Field of the Invention

The present invention relates to a liquid crystal display device, or the like, used for a computer, word processor, etc., and also to a tape carrier package mounted on the display device which package includes a semiconductor chip for driving a display medium such as for example a liquid crystal material.

2. Description of the Related Art

FIG. 23 illustrates an example of a liquid crystal display device, which includes: a liquid crystal panel including an upper glass plate 15 and a lower glass plate 16 provided so as to interpose a liquid crystal material (not shown); a backlight unit 21 as a light source; a semiconductor chip 5 for driving the liquid crystal material; a tape carrier package (TCP) 7 connecting the semiconductor chip 5 to the wiring (or lines) provided on the lower glass plate 16; a printed board 23 for connecting a plurality of TCPs 7 together; and a vessel 22 for covering the liquid crystal panel.

Known methods for mounting a semiconductor chip for driving a liquid crystal material include: mounting the semiconductor chip directly on the liquid crystal panel; and mounting the semiconductor chip supplied in the form of a tape carrier package (TCP) on the liquid crystal panel.

In the latter method, as shown in FIG. 23, an electrode provided on the lower glass plate 16 and a patterned portion of a conductive material on the TCP 7 are attached together via an anisotropic conductive film (not shown) by thermo compression bonding, so as to provide a plurality of TCPs along the periphery of the liquid crystal panel. The plurality of TCPs 7 mounted around the liquid crystal panel are connected to the common printed board 23 which is provided with printed lines. Signals for conducting a display via the liquid crystal material are supplied to the TCPs 7 through the printed board 23. Moreover, conventionally, some chip components (e.g., a chip capacitor), are mounted on the printed board 23 if they cannot be included in the semiconductor chip 5. The vessel 22 is provided so as to surround the periphery of the liquid crystal panel.

The assembly steps for the liquid crystal display device include: connecting a liquid crystal driving output terminal of the TCP 7 to an electrode provided on the lower glass plate 16 via the anisotropic conductive film (not shown); and thereafter connecting an input signal terminal of the TCP 7 to the printed board 23 by soldering or via the anisotropic conductive film.

When a bendable TCP 25 is used, as shown in FIG. 24, the TCP 25 is bent after the above steps so that the printed board 23 matches the shape of the module.

On the other hand, the former method includes a Chip On Glass (COG) method, where the semiconductor chip 5 having metal bumps is mounted facing down directly onto the lines provided on the lower glass plate 16. There are different ways for making connections in this COG method such as: one described in Japanese Laid-open Publication No. 4-105331, etc., where connections are directly made by solder bumps after which the gap between the semiconductor chip and the glass plate is filled with a resin; and one described in Japanese Laid-open Publication Nos. 4-76929, 4-71246, 4-317347, etc., where, as shown in FIG. 25, the metal bumps of the semiconductor chip 5 are connected to the lines on the lower glass plate 16 via an anisotropic conductive film (ACF) 20 made of a resin (binder) 20b including conductive particles 20a. In the latter method, the resin (binder) 20b of the anisotropic conductive film 20 is used in place of the filling resin in the former method. Recently, the COG method using the anisotropic conductive film which can be easily repaired and which dose not require the resin filling has been widely used.

To each semiconductor chip used in the method where the printed board is used or in the COG method, input signals and power voltages are parallelly input through the lines provided on the printed board or by the ITO lines provided on the liquid crystal panel. However, chip select signals are synchronized with the clock signals parallelly input so that signals are transferred among the semiconductor chips.

In recent years, a prevailing technique is to ensure a larger display area for a certain module size by reducing the width by which the liquid crystal panel extends beyond the glass plate (i.e., the frame size). Moreover, the cost of a liquid crystal panel is higher than that of a CRT, and great cost reduction has been demanded for the liquid crystal panels.

Under such circumstances, as a method using a TCP, it has been proposed (Japanese Design Patent Application No. 2-40145) to use a slim-type TCP which is obtained by shaping a semiconductor chip into an elongated shape in order to reduce the width by which the TCP extends beyond the glass plate. Moreover, it has also been proposed (Japanese Laid-open Publication No. 2-132418, etc.) to reduce the frame size by bending a portion of the TCP which extends beyond the glass plate, as described above.

However, both of the proposed methods require the printed board, the TCP and the liquid crystal panel, and the assembly process thereof requires two connection steps, i.e., one for connecting the glass plate of the liquid crystal panel with the TCP, and another for connecting the TCP with the printed board. This increases material cost and the number of steps to be performed, thereby presenting a bottleneck in reducing the cost of a liquid crystal module.

Moreover, another method has been proposed (Japanese Laid-Open Publication No. 5-297394, Japanese Laid-Open Publication No. 6-258653, etc.) in which a liquid crystal display device includes the liquid crystal panel (reference numeral 15 in FIG. 26A denotes the upper glass plate of the liquid crystal panel) and the TCP 7 but does not include a printed board, as shown in FIG. 26A. In this method, as shown in FIG. 26B, adjoining two TCPs 7 are directly connected to each other, whereby input signals are transmitted/received through only the TCPs 7.

In the case of this proposed method, although it is possible to reduce the material cost for the printed board, two connection steps are required; one for connecting the glass plate of the liquid crystal panel with the TCP 7; and another for connecting the TCPs 7 together, thereby providing no cost reduction in terms of the number of steps to be performed. Moreover, in this proposed method, if one of the continuously connected TCPs 7 becomes defective, the defective one of the TCPs 7 has to be removed. Such a removal may give some mechanical damage to the adjacent TCPs 7, and may also present a burden on the process in terms of the number of steps to be performed, requiring disconnection at three positions (at the right and left input terminals and at an output terminal of the defective TCP 7). Moreover, since transmission/reception of input signals is all performed between the TCPs 7, the input terminals thereof need to be arranged respectively on the left and right sides, perpendicular to the side on which the output terminal thereof is provided. The input lines connected respectively to the input terminals will also have to be arranged, thereby increasing the width of the TCP 7, which may then conflict with the frame size limitation of the liquid crystal panel. Moreover, the increased area of the TCP 7 will result in an increased material cost. Thus, the proposed method has some difficulty in repair, does not reduce the number of connection steps; and increases the TCP size.

On the other hand, in the COG method, since the semiconductor chip is directly mounted on the glass plate, the packaging cost thereof is lower than that in a method using a TCP. Moreover, when input signals can be supplied to the semiconductor chip via the lines on the glass plate, the printed board may also be eliminated, thereby presenting a significant advantage in terms of cost. In such a case, there is another advantage that the mounting process is done only by mounting the semiconductor chip on the glass plate, thereby reducing the mounting cost.

However, in practice, the configuration as described above is only possible for a relatively small liquid crystal panel of up to about 3 to 6 inches, but is not possible for a currently-dominant large liquid crystal panel of about 10 inches or more. The reason therefor is that the sheet material used for the lines provided on the glass plate has a resistance, whereby the wiring resistance of the input signal lines cannot be suppressed to a low level. When the glass plate is small, the wiring length on the glass plate is short. However, when the glass plate is large, the wiring length on the glass plate is long, a voltage across the length on the glass plate drops, and a valid signal is not transmitted to the liquid crystal driving semiconductor chip.

Moreover, in view of the above-described wiring resistance, the wiring width on the glass plate may have to be increased even in a small liquid crystal panel, whereby the chip mounting area on the glass plate becomes wider than the TCP. Such an increase in the size of the glass plate may reduce the number of panels which can be produced from one mother glass, whereby the cost reduction may not be achieved in terms of the module as a whole.

A method (Japanese Laid-Open Utility Model Publication No. 4-77134, etc.) has been proposed as a countermeasure to the above problem. In the method, as shown in FIG. 27, a flexible wiring board 18 is provided on the lower glass plate 16 of the liquid crystal panel in the vicinity of the mounting portion of each semiconductor chip 5, and the lines of the flexible wiring board 18 are directly connected to the lines provided on the lower glass plate 16, whereby input signals are transmitted through the flexible wiring board 18. This method requires the flexible wiring board which corresponds to the printed board in the method using a TCP, whereby there is no advantage in terms of the cost and process.

Moreover, when using a printed board in a large-size liquid crystal panel, a stress is applied to the TCP due to the difference between a linear expansion coefficient of the printed board and a linear expansion coefficient of the glass plate. Consequently, wire breaks may occur in the TCP, thus lowering reliability. Another proposed method (Japanese Laid-Open Publication No. 8-15716) is to use, in place of the printed board, a substrate obtained by providing lines on a glass plate. However, this method also has a problem that the glass plate wiring substrate is costly, while the wiring resistance thereof is also higher than that of the printed board.

Furthermore, in the case of the COG method, since chips are provided as bare chips, a test is normally made when it is still in the form of a wafer, but no test will be made after it is diced into individual chips. Therefore, when the semiconductor chip is mounted on the glass plate, it is difficult to ensure the quality of the semiconductor chip (i.e., it is not a Known Good Die). Particularly, in the case of a large panel on which a large number of semiconductor chips are mounted, the repair rate is likely to increase, thereby possibly increasing the cost.

In the case of the COG method, or in the case of using the glass wiring substrate in place of the printed board, the resistance between the line for transmitting the input signal can be reduced by providing an aluminum line in the semiconductor chip. Thus, making it possible to reduce the chances of being transmitted an invalid signal because of low resistance in the input signal line. However, the employment of aluminum requires extension of the width of an internal line of the semiconductor chip. The internal line needs to be designed with a large width so that the semiconductor chip is able to flow large current and increase the reliability of the device. As a result of the width increase, a wiring region of the chip becomes large which in turn increases chip area. The increase in chip area results in material costs for the chip to increase. Additionally, by using the above method, a clock signal can not be transmitted, because the semiconductor generates noise which may influence the signal transmitted therethrough. For example, a clock signal being transmitted via the semiconductor chip may become corrupted by noise from the chip.

SUMMARY OF THE INVENTION

According to one aspect of this invention, a tape carrier package includes: a line provided on one surface of a tape substrate; and a semiconductor chip mounted on an other surface of the tape substrate, the semiconductor chip having an electrode which is electrically connected to the line. The line extends from one end to an opposite end of the tape substrate and includes a connection where an intermediate line portion provided in a middle between the ends is electrically connected to the electrode.

In one embodiment of the invention, the connection is formed to overhang substantially at a device hole provided in the tape substrate and is electrically connected to the electrode of the semiconductor chip substantially at the overhang portion.

In another embodiment of the invention, the intermediate line portion including the connection is formed to protrude so as to extend over the device hole; and the connection is in the portion overhanging substantially at the device hole.

In still another embodiment of the invention, the intermediate line portion formed to protrude is in one of an I shape and a U shape.

In still another embodiment of the invention, the device hole is provided as a notch substantially at a location over which the linearly-shaped intermediate line portion extends.

In still another embodiment of the invention, the intermediate line portion including the connection is bent in a V shape toward the device hole; and a portion of the intermediate line portion which extends substantially at the device hole is linearly shaped.

In still another embodiment of the invention, the linearly-shaped intermediate line portion which extends substantially at the notch is provided with a bent buffering portion.

In still another embodiment of the invention, the device hole is formed separately from other openings formed in the tape substrate; and the intermediate line portion is provided so as to run linearly substantially at the device hole.

In still another embodiment of the invention, the line is for a power source; and the tape substrate is further provided with a signal line to be electrically connected to the electrode of the semiconductor chip.

In still another embodiment of the invention, a plurality of the lines are provided on the tape substrate; and an electronic component different from the semiconductor chip is connected and mounted between the lines.

In still another embodiment of the invention, the semiconductor chip includes a buffer circuit for signal connection between the semiconductor chip and a semiconductor chip provided on an other tape carrier package.

In still another embodiment of the invention, the buffer circuit included in the semiconductor chip is formed by an input buffer circuit and an output buffer circuit.

In still another embodiment of the invention, the buffer circuit included in the semiconductor chip is formed by an input/output buffer circuit.

According to another aspect of this invention, a display device is provided, which includes the tape carrier package of present invention provided on a glass plate of a display panel. Adjoining ones of the tape carrier packages are electrically connected to one another via a line provided on the glass plate.

In one embodiment of the invention, an anisotropic conductive film is used for the connection between the line provided on the glass plate and the tape carrier package.

In another embodiment of the invention, the line provided on the glass plate is a line directly formed on the glass plate.

In still another embodiment of the invention, an electronic component different from the semiconductor chip is connected and mounted onto the line provided on the glass plate.

In still another embodiment of the invention, the display panel is a liquid crystal panel.

In still another embodiment of the invention, the line provided on the glass plate is a line formed on a substrate other than the glass plate.

In still another embodiment of the invention, an electronic component different from the semiconductor chip is connected and mounted onto the line provided on the glass plate.

Hereinafter, the function of the present invention will be described.

In the TCP of the present invention, the input terminals for the lines are provided on a side perpendicular to a side on which an output terminal is provided, whereby it is possible to ensure the quality of the semiconductor chip (i.e., it is possible to determine whether the chip is good or bad), by performing a test using the input terminal.

Moreover, in the display device of the present invention, the TCP including the input terminals is mounted on the display panel, where electrical connection between adjoining TCPs is achieved by the lines provided on the display panel. Therefore, the provision of the lines for input signals (which presents the most significant problem), is required only on the TCP and on the glass plate, whereby it is possible to reduce the material cost, and also to reduce the number of connection steps to be performed to ⅓ of that in the conventional technique, since the connection of the input/output terminals can be done in a single step of mounting the TCP. Therefore, a considerable cost reduction can be realized also in terms of the number of connection steps to be performed.

Moreover, according to the present invention, only a defective TCP needs to be removed from the glass plate, and only the surface of the glass plate has to be washed, whereby a repair process can be achieved with half the work of the conventional technique. Moreover, a portion of the TCP extending beyond the glass plate can be bent when mounting a bezel, and the like, whereby the frame size can also be reduced.

Since a printed board with a large linear expansion coefficient is not used, reliability against the temperature variation is improved as compared to the conventional technique. Moreover, mechanical reliability against vibration, or the like, can also be increased to a level comparable to that in the COG method, since there is no movable section or no section to be oscillated as compared to the TCP or the printed wiring board in the conventional TCP method.

Moreover, a bonding process to the glass plate is performed in a single step via the anisotropic conductive film. Since the lines on the TCP, the lines on the semiconductor chip, and the lines on the glass plate can be electrically connected to one another by the anisotropic conductive film, with which the function of the multi-layer lines of the conventional printed board can be replaced, and it is possible to transmit/receive input signals at a low wiring resistance without using a continuous large external substrate such as the flexible wiring board or the printed board.

Furthermore, by providing a buffer circuit in the semiconductor chip while not using the aluminum lines provided in the semiconductor chip, the wiring region inside the semiconductor chip can be reduced, and the chip area can also be reduced, whereby a reduced cost and an improved reliability can both be realized.

Furthermore, by transmitting the input signals via the buffer circuit within the semiconductor chip, it is possible to shape the waveform of the input signals, whereby the influence of the noise can be suppressed, and even signals which require a fast operation such as a clock signal can be reliably transmitted in a normal manner.

Furthermore, by providing the buffer circuit with a structure of an input/output buffer circuit, it becomes possible to freely and externally alter the signal transmission direction, whereby the semiconductor chip can be shared.

Thus, the invention described herein makes possible the advantages of (1) providing a tape carrier package in which the quality of a semiconductor chip can be easily ensured (i.e., it is possible to determine whether the chip is good or bad), before mounting the semiconductor chip; and (2) providing a display device using such a tape carrier package, in which the number of connection steps can be reduced, repair can be easily reformed, and the reliability thereof improved.

These and other advantages of the present invention will become apparent to those skilled in the art upon reading and understanding the following detailed description with reference to the accompanying figures.

BRIEF DESCRIPTION OF THE DRAWINGS

FIG. 1A is a plan view illustrating the TCP before a cutting process; FIG. 1B is a plan view illustrating a left input terminal section; FIG. 1C is a plan view illustrating a significant feature of the present invention; FIG. 1D is a plan view illustrating a right input terminal section.

FIG. 5A is a plan view illustrating a TCP according to Example 3 of the present invention; and FIG. 5B is an enlarged plan view illustrating a portion thereof.

FIG. 12A is a perspective view illustrating an electronic component mounted on an TCP connection substrate; and FIG. 12B is a perspective view illustrating an electronic component built within or on a surface of a substrate, with an LTCC substrate being used as the TCP connection substrate.

DESCRIPTION OF THE PREFERRED EMBODIMENTS

Hereinafter, the present invention will be described by way of illustrative examples with reference to the accompanying figures.

Example 1

Figure 1:
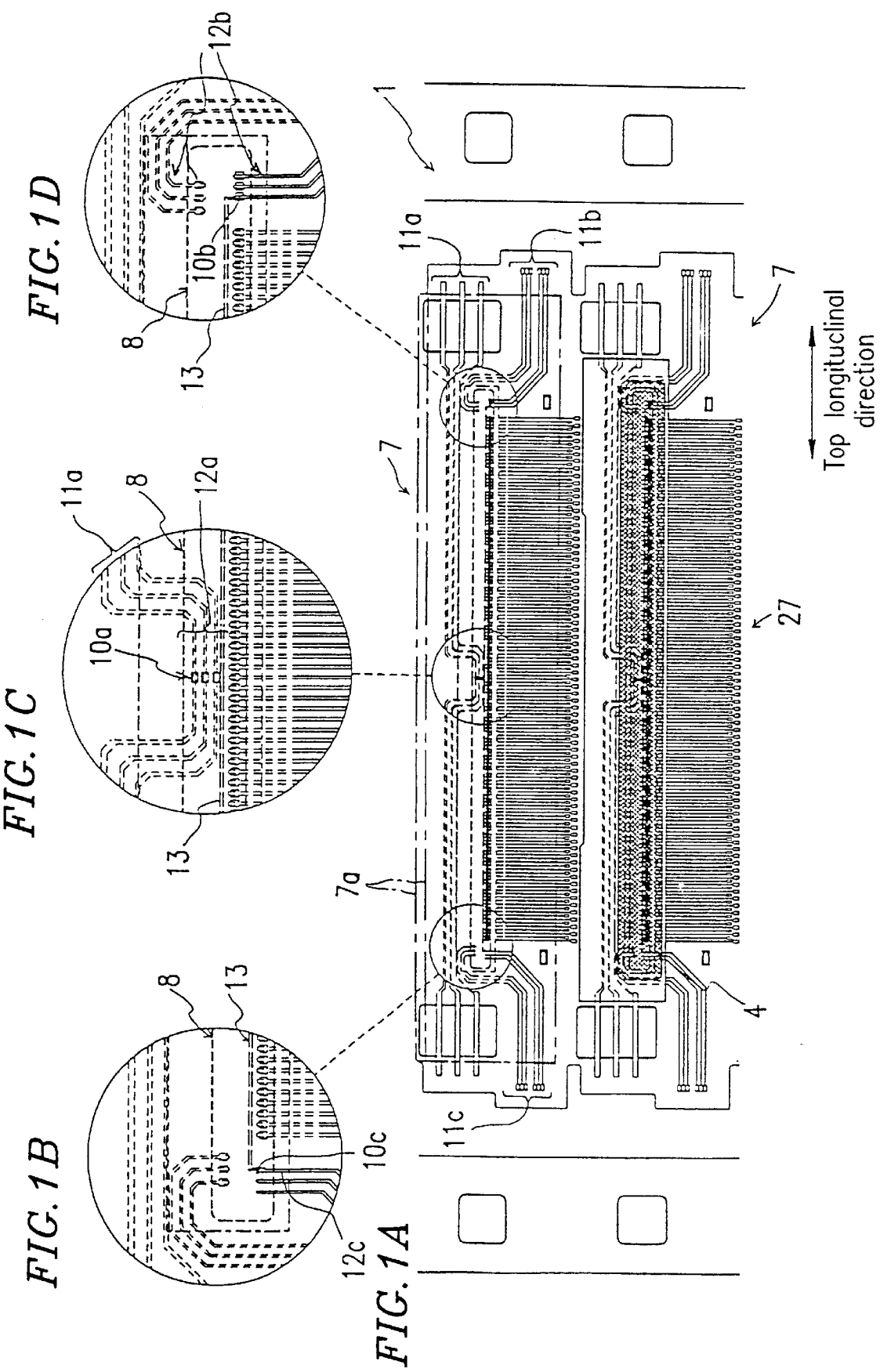
FIGS. 1A to 1D are each a plan view illustrating a TCP according to Example 1 of the present invention, where
Figure 2:
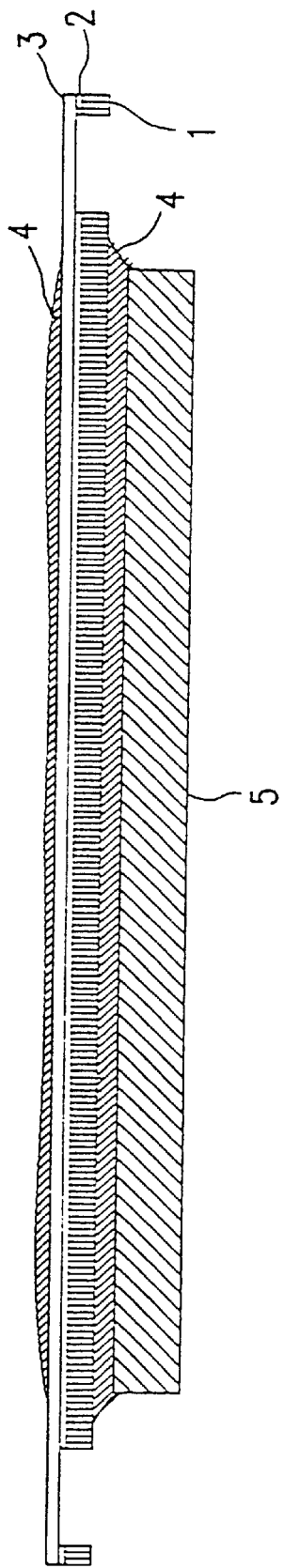
FIG. 2 is a cross-sectional view illustrating an intermediate portion of the TCP according to Example 1 between the left and right input terminal sections.

FIGS. 1A to 1D are each a plan view illustrating a TCP according to Example 1 of the present invention, where FIG. 1A is a plan view illustrating the TCP before a cutting process; FIG. 1B is a plan view illustrating a left input terminal section; FIG. 1C is a plan view illustrating a significant aspect of the present invention; FIG. 1D is a plan view illustrating a right input terminal section. Moreover, FIG. 2 is a cross-sectional view illustrating an intermediate portion of the TCP between the left and right input terminal sections.

The TCP 7 used in the present example may be obtained by laminating an electrolytic copper foil 3 (thickness: about 18 $\mu$m, minimum wiring width: about 30 $\mu$m) to form lines on Upilex as a tape substrate 1 (thickness: about 50 $\mu$m, produced by: Ube Industries, Ltd.) via an adhesive layer 2. As the material for the tape substrate 1, polyimide films other than Upilex such as Apical (Kanegafuchi Chemical Ind. Co., Ltd.), Kapton (Du Pont-Toray Co., Ltd.) may also be used. Moreover, a non-polyimide material can also be used. For example, films such as glass epoxy, aramid, BT resin, polyethylene terephthalate, polyphenylether may also be used. Furthermore, it is also applicable to form the TCP such that the electrolytic copper foil 3, being a conductor, is patterned directly on the substrate 1, without using the adhesive layer 2.

In the instance shown in FIG. 1A, the electrolytic copper foil 3 forms a group of output terminals 27 which is provided in the lower side of the figure in the central portion of the TCP 7 along the longitudinal direction thereof, and also forms, in the upper side of the figure, power source leads 11a, input terminals 11b and 11c, inner leads 12b and 12c, and the like. Moreover, as shown in FIG. 2, a sealing resin 4 is provided above the electrolytic copper foil 3, except for a portion of the electrolytic copper foil 3 (e.g., except for the terminal section thereof). The semiconductor chip 5 is provided below the tape substrate 1, and the sealing resin 4 is provided so as to surround the semiconductor chip 5.

As shown in FIG. 1C, the power source leads 11a overhang over a device hole 8 in the vicinity of the center of the device hole 8, with the overhang pattern 12a being connected to a power source electrode bump 10a provided on the semiconductor chip 5 which is located below the device hole 8. An end of a line is connected to each of the input terminals 11b except for the power source electrode bump 10a, while the other end of the line is inner-lead-bonded to a bump 10b formed on the semiconductor chip 5 via the inner lead 12b provided in the device hole 8. Therefore, the input signal is transmitted to the logic circuit section in the semiconductor chip 5 and is transmitted to a bump 10c on the opposite side through lines 13 in the chip. A buffer circuit is provided in the semiconductor chip 5, as necessary, so as to take out the input signal from the bump 10c after synchronizing the input signal. Thereafter, the input signal again passes through the lines on the TCP via the inner lead 12c so as to go outside through the input terminal 11c.

That is, in the TCP: the left and right input terminals are connected to each other by the continuous lead 11a on the TCP; the device hole 8 is provided as an opening in the tape substrate so as to run across the continuous lead 11a, while the electrodes and the bumps are formed on the semiconductor chip 5 so as to oppose the opening; a bonding process is then performed to the continuous lead 11a which is provided on the TCP 7 so as to overhang over the opening; and a signal is supplied to the semiconductor chip 5. Thus, the lines in the chip do not have to be used as a signal propagation path, for the terminals for which the wiring resistance requirement is strict, e.g., a power source terminal.

Each inner lead is plated with tin so as to have a thickness of about 0.2 μm, and is connected to the connection bump on the semiconductor chip 5. Other than tin, Ni/Au or solder may be used as a conductive material to be plated on the TCP. The periphery of the device hole 8 is sealed with the sealing resin 4.

In Example 1, the portion of the tape to be cut into a single TCP is indicated by an alternate long and short dash line (7a). The end on the power source leads 11a may appropriately be shaped into one of various shapes by changing the cutting location indicated by the dash line (7a).

Example 2

Figure 3:
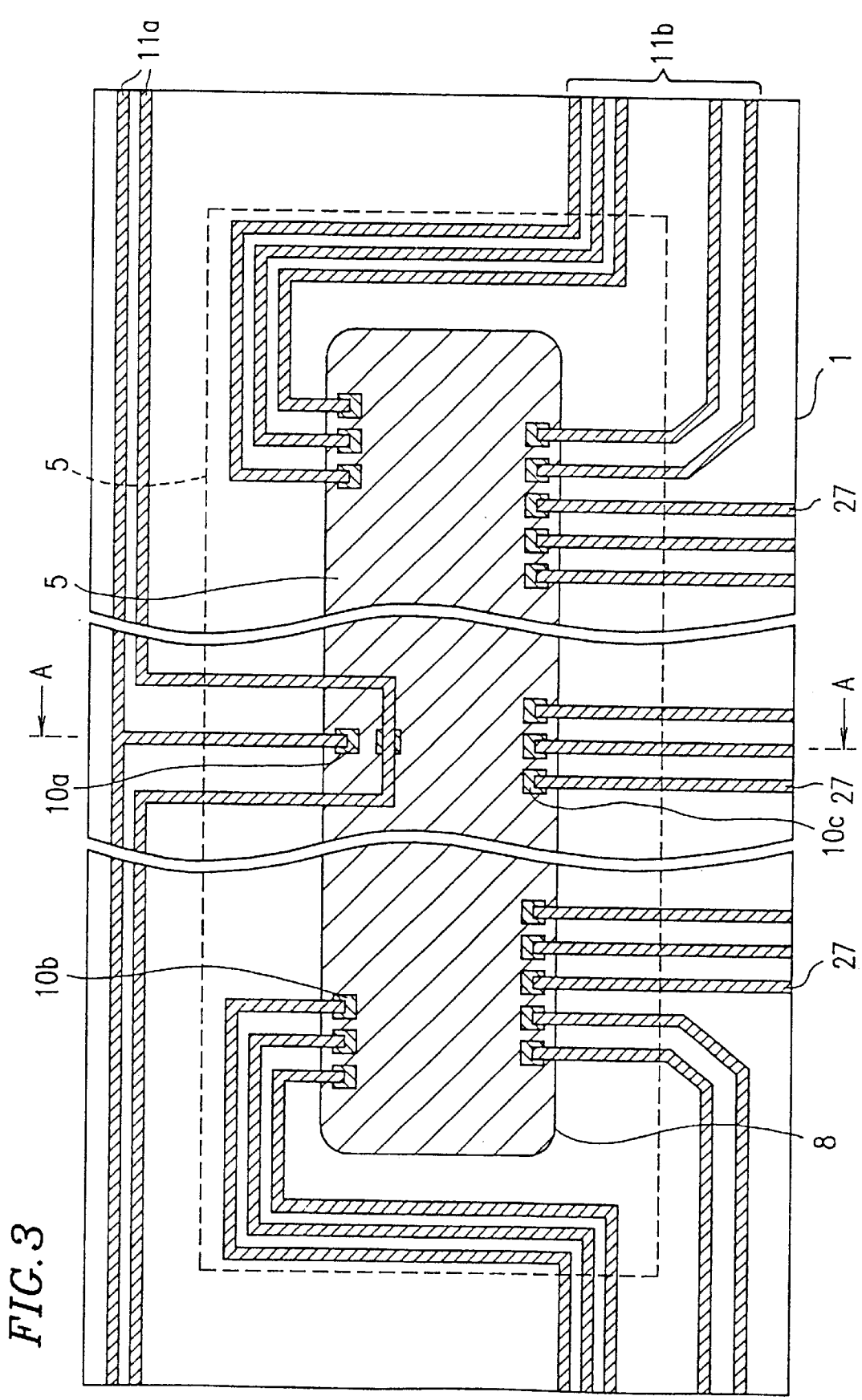
FIG. 3 is a plan view illustrating an important part of a TCP according to Example 2 of the present invention.
Figure 4:
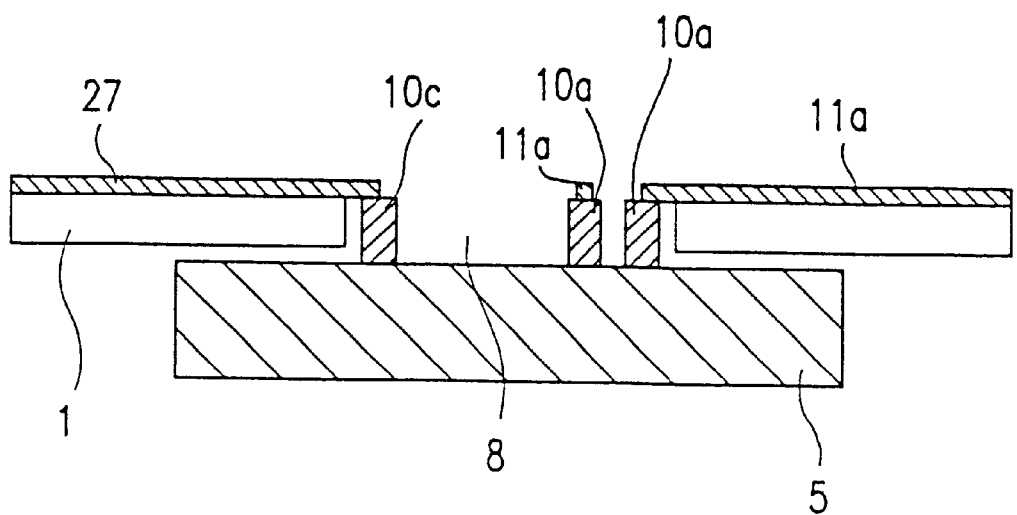
FIG. 4 is a cross-sectional view taken along A—A line in FIG. 3.

FIG. 3 is a plan view illustrating an important part of a TCP according to Example 2 of the present invention; and FIG. 4 is a cross-sectional view taken along the A—A line in FIG. 3.

A distinctive feature of Example 2 is how the power source leads 11a are arranged. Specifically, the overhang pattern 12a of the outermost power source lead 11a extending over the device hole 8 is shaped into an I shape. The overhang pattern 12a of the other power source lead 11a extending over the device hole 8 is shaped into a U shape. The overhang patterns 12a are connected respectively to the power source electrode bumps 10a provided on the semiconductor chip 5. In the figure, the output terminals 27 are partially omitted.

In such a case, as compared to Example 1, the wiring length can be reduced by the length of the I-shaped lead 11a, and the resistance thereof can be reduced, while the wiring region of one U-shaped pattern can also be reduced, whereby the design freedom can be increased.

Example 3

FIGS. 5A and 5B are each a plan view illustrating a TCP according to Example 3 of the present invention, where FIG. 5A illustrates several TCPs; and FIG. 5B illustrates an important part of the TCP.

Example 3 is the same as Example 1 in terms of the flow of the signals and the function thereof. A distinctive feature of Example 3 is that a notch 9 is provided at a certain position along the length of the device hole 8, and the overhang patterns 12a is linearly shaped over the notch 9, whereby the overhang patterns 12a and the power source electrode bumps 10a provided on the semiconductor chip 5 are connected to each other over the notch 9. In Example 3, the power source leads 11a form a V-like shape in the vicinity of the overhang patterns 12a thereof.

When employing such an overhang pattern 12a, there is an advantage in that the curved (U-shaped) portion thereof over the device hole 8 may be relatively short, or may even be omitted. However, since the power source electrode bumps 10a extends perpendicularly to the array of output terminals 27, the width of the semiconductor chip may possibly be increased. Therefore, it is preferable to select one of Examples 1 to 3, which would be advantageous in terms of the manufacturing technology and cost, considering the circumstances in which the TCP will be used and the LSI layout.

Example 4

Figures 6A, 6B:
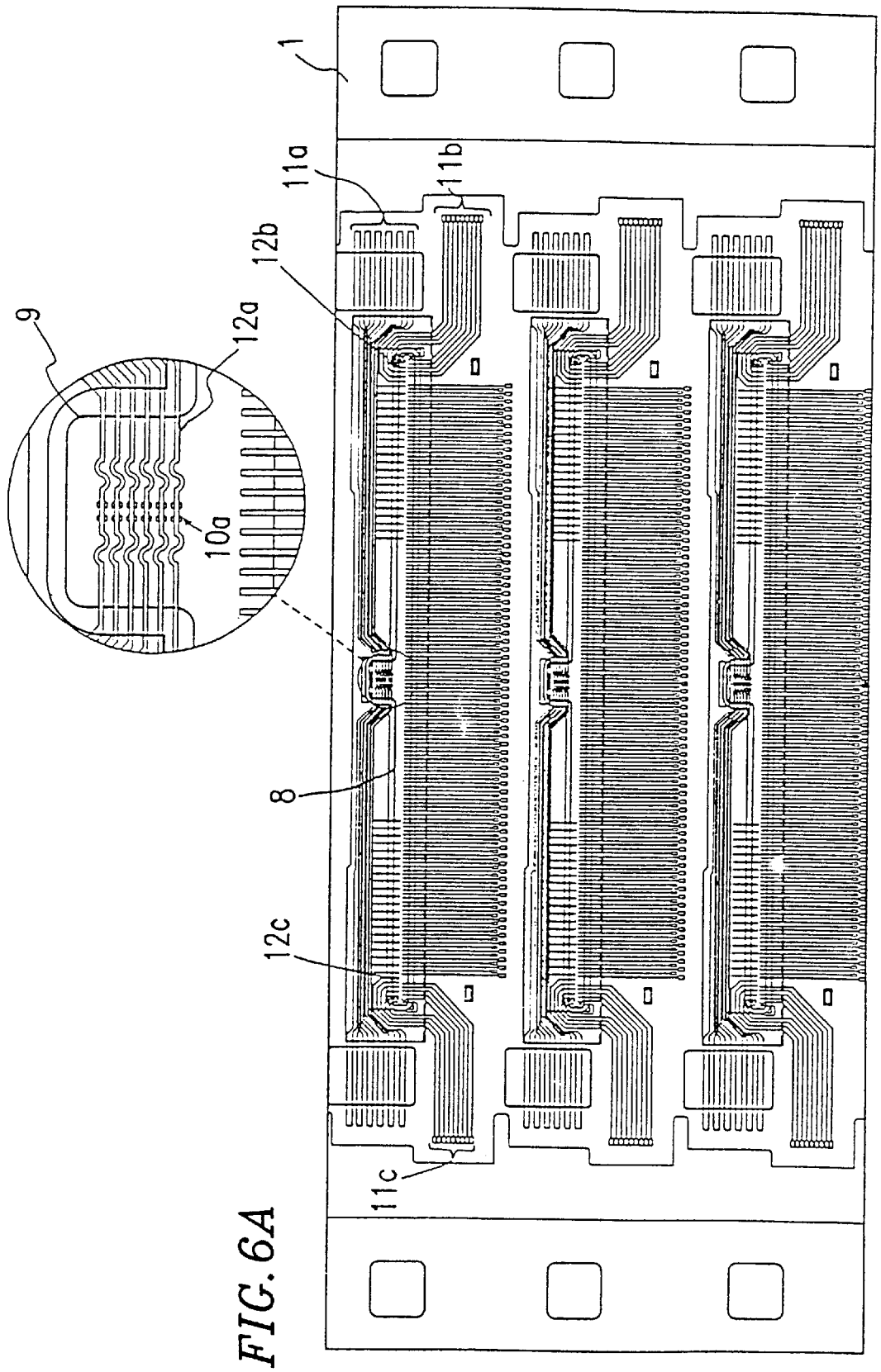
FIG. 6A is a plan view illustrating a TCP according to Example 4 of the present invention.
FIG. 6B is an enlarged plan view illustrating a portion thereof.

FIGS. 6A and 6B are each a plan view illustrating a TCP according to Example 4 of the present invention, where FIG. 6A illustrates several TCPs; and FIG. 6B illustrates an important part of the TCP.

In Example 4, as compared to Example 3, the overhang patterns 12a is provided with a buffering function. Specifically, a portion of the overhang patterns 12a which is overhanging over the device hole 8 is provided with the buffering function. In the instance shown in FIG. 6B, two S-shaped portions are provided in each lead. Thus, the present example provides some motion freedom between the ends of the overhang patterns 12a, whereby the power source leads 11a can easily stretch during the inner-lead-bonding process. Such a structure is resistant against wire breaks.

When a sufficient interspace cannot be provided between bumps, for example, the buffering portion does not have to be S-shaped, but may also be "<"-shaped or W-shaped.

It should be noted that the present example can be applied not only to Example 3, but also to Examples 1 and 2.

Example 5

Figure 7:
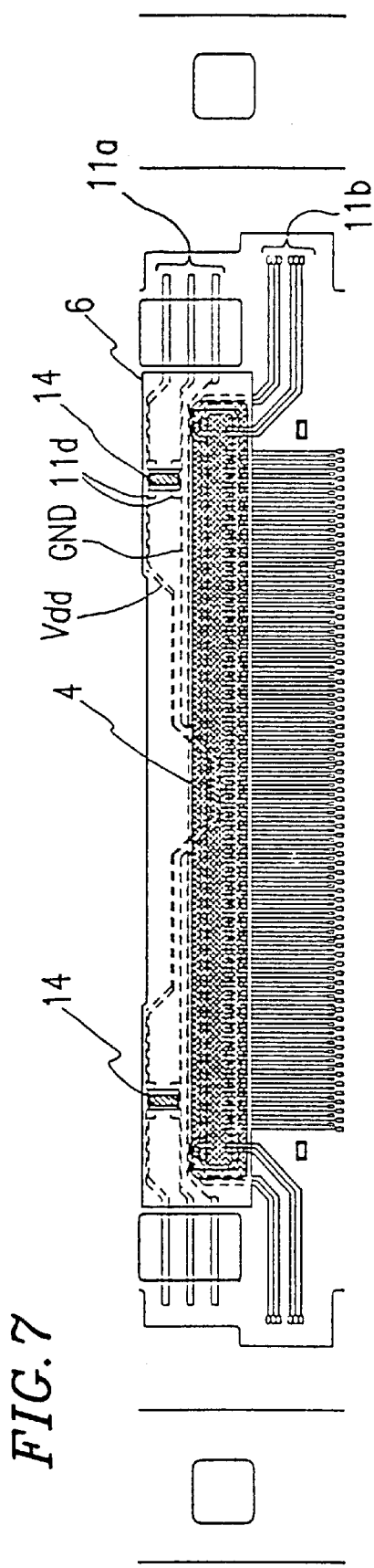
FIG. 7 is a plan view illustrating a TCP according to Example 5 of the present invention.

FIG. 7 is a plan view illustrating a TCP according to Example 5 of the present invention.

In the TCP of the present example, a chip component (e.g., a chip capacitor) 14 is mounted on the leads 11a on the tape substrate. In such a case, it is preferable to provide a soldering pad 11d to each of a power source line Vdd and a ground line GND of the power source leads 11a, to cover the periphery thereof with a solder resist 6, and to mount the chip component 14 thereon. The mounting process of the chip component 14 may be performed on a tape substrate, on a TCP after mounting the semiconductor chip 5 thereon, or on the TCP after mounting it on a liquid crystal panel.

Example 6

Figure 8:
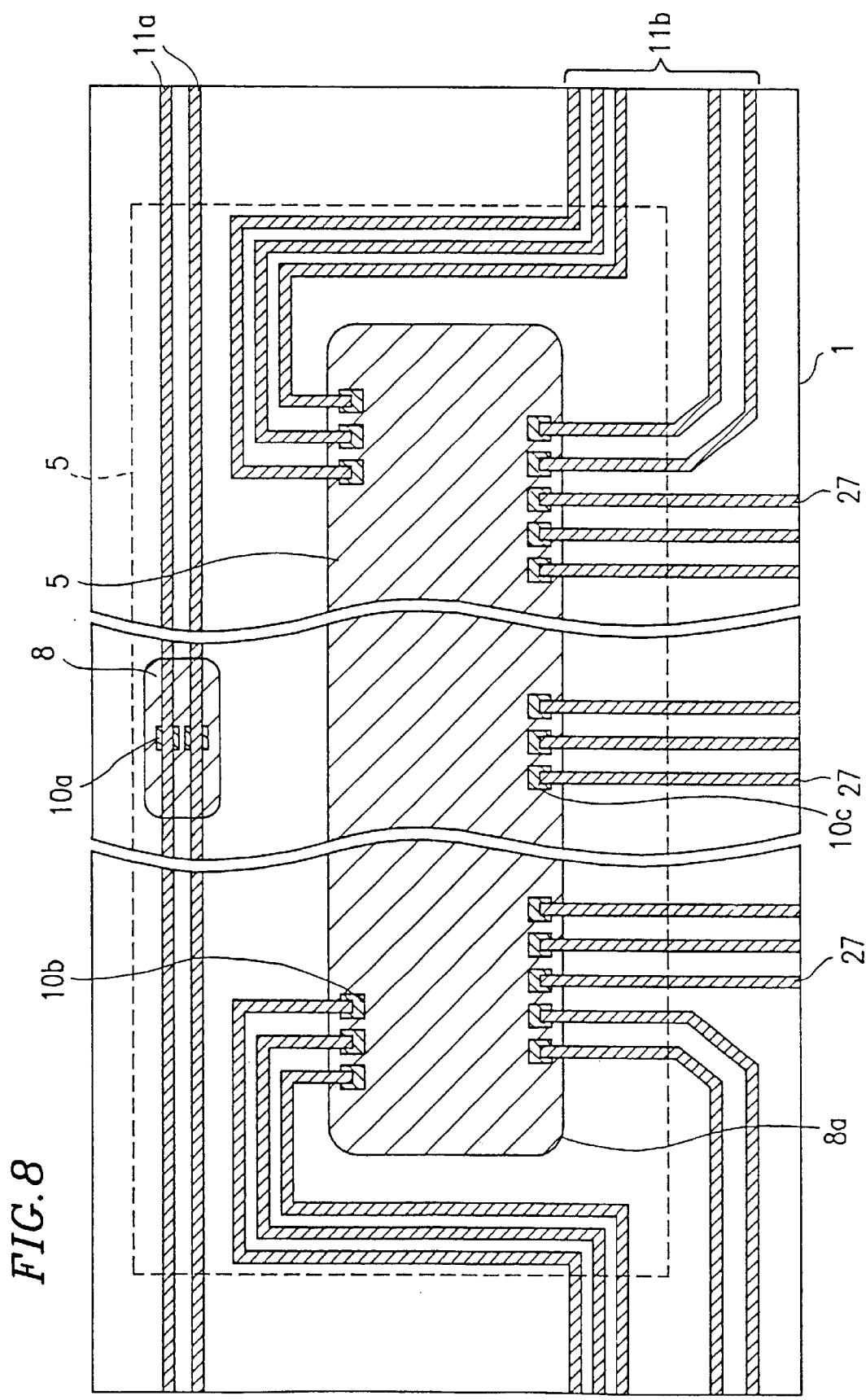
FIG. 8 is a plan view illustrating a TCP according to Example 6 of the present invention.

FIG. 8 is a plan view illustrating a TCP according to Example 6 of the present invention.

In the present example, the power source leads 11a are formed substantially linearly so that the respective intermediate portions thereof run substantially linearly over the device hole 8. Each lead 11a is electrically connected, via a connection, to power source electrode bumps 10a of the semiconductor chip 5 at the midpoint of the intermediate line portion. Moreover, the device hole 8 is formed separate from other openings (e.g., another device hole) 8a. As shown in the present example, the device hole 8 can be shaped into any appropriate shape, as necessary, as long as the shape allows for connection between the semiconductor chip 5 and the power source leads 11a. The group of output terminals 27 is partially omitted in FIG. 8. Other than this, the configuration of the present example is the same as that shown in FIG. 3 (Example 2), and will not be further described.

Example 7

Figures 9A, 9B:
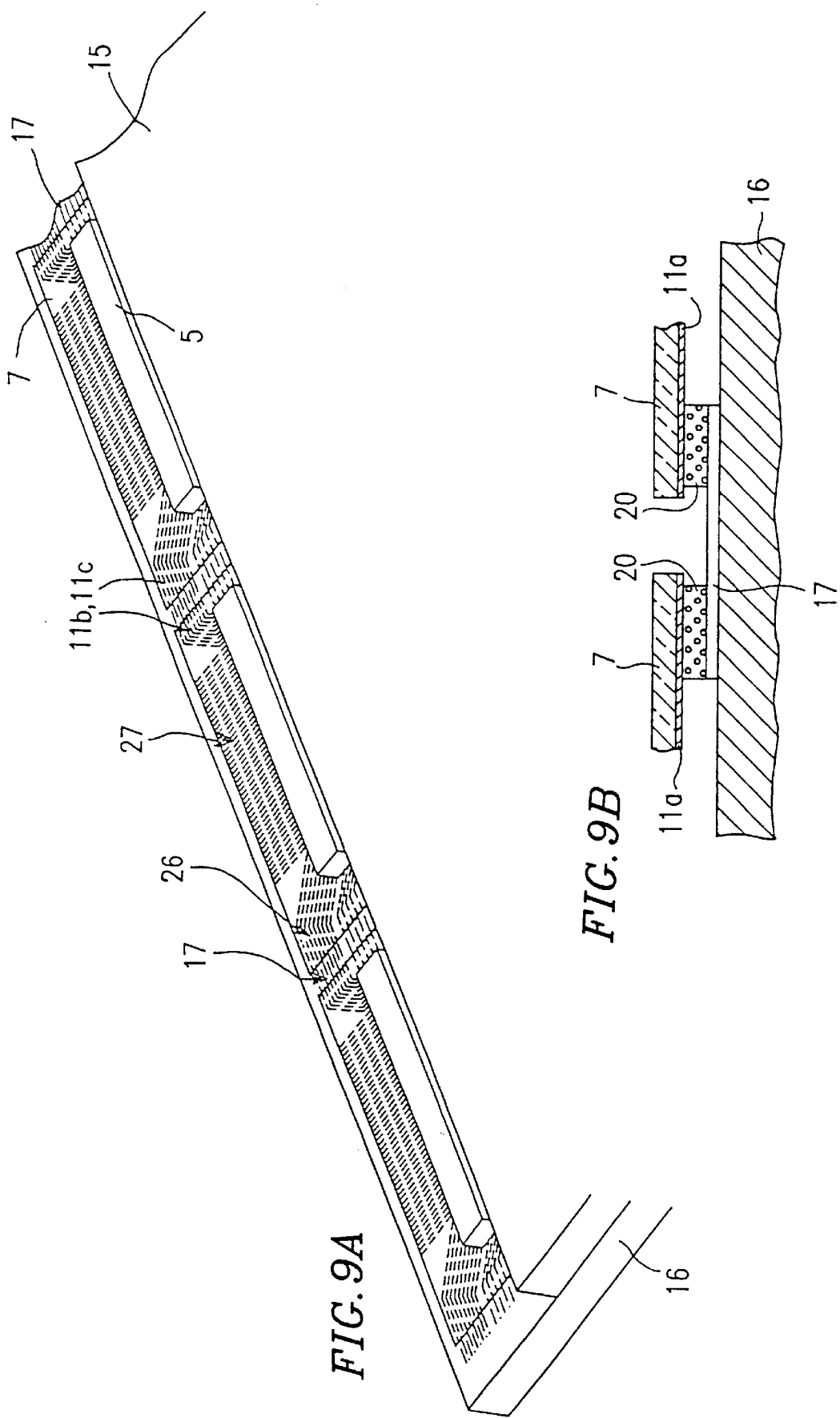
FIG. 9A is a perspective view illustrating a TCP mounting portion of a liquid crystal display device according to Example 7 of the present invention.
FIG. 9B is a cross-sectional view illustrating an important part thereof.

FIG. 9A is a perspective view illustrating a TCP mounting portion of a liquid crystal display device according to Example 7 of the present invention; and FIG. 9B is a cross-sectional view illustrating how the TCP is mounted on the liquid crystal display device.

In the liquid crystal display device of the present example, the TCPs 7, as being cut from the tape, are connected and secured individually to a wiring pattern 17 formed on the lower glass plate 16 of the liquid crystal panel via the anisotropic conductive film 20. In the figure, the TCP 7 exists entirely over the lower glass plate 16 including the tape. However, a portion of the tape of the TCP 7 or a portion of the semiconductor chip 5 may extend beyond the lower glass plate 16. Even in such a case, there still exists the advantage of the present invention, i.e., not requiring a printed board as a common wiring board.

The mounting process is performed as follows. The TCP 7 is first supplied as a tape, and is produced by cutting the tape using a metal mold, or the like. Next, the TCP 7 is aligned and temporally connected to a predetermined wiring connection provided on the lower glass plate of the liquid crystal panel. Then, a production press fit process is performed so as to fix the input/output terminal section of the TCP 7 onto the lower glass plate.

The connection between the lower glass plate 16 of the liquid crystal panel and the TCP 7 is achieved by using the anisotropic conductive film 20. It is possible to simultaneously achieve the connection of the output terminal and the connection of input terminal at once by adjusting the shape of a bonding tool or the apparatus. Even if one of the TCPs 7 turns out to be defective at a test conducted after mounting all the TCPs 7, the defective TCP 7 can be removed from the lower glass plate 16 so as to be replaced with a non-defective TCP 7 without damaging the TCPs 7 adjoining the defective TCP 7. For repair, the defective TCP 7 is removed from the lower glass plate 16 by using some heat, and the lower glass plate 16 is then washed with a special-purpose solvent, after which another non-defective TCP 7 is mounted according to the procedure as described above.

Figure 10:
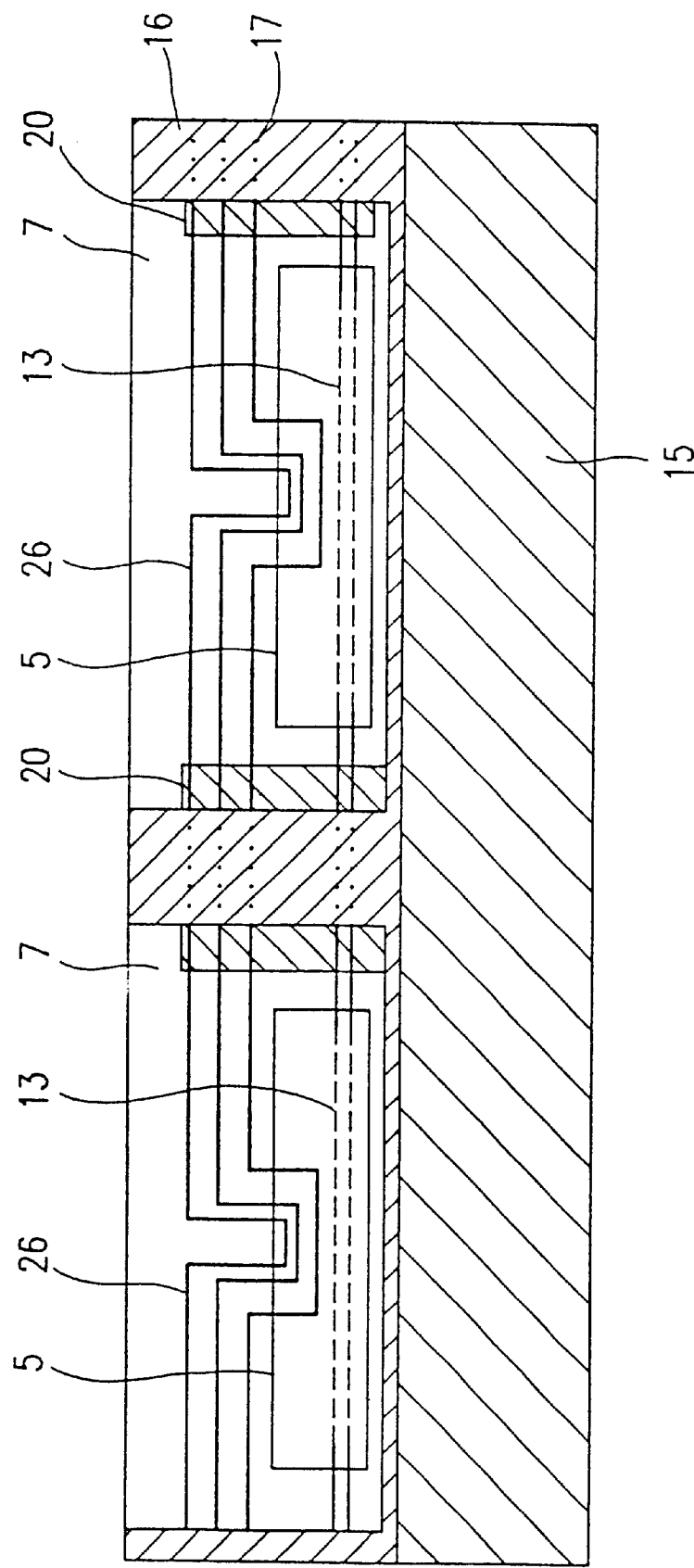
FIG. 10 is a diagram showing signal flows in an electric connection in the liquid crystal display device according to Example 7.

FIG. 10 illustrates signal flows in an electric connection between the liquid crystal panel and the TCP. As shown in the figure, electric signals are supplied to a plurality of TCPs 7 partially via the wiring pattern 17 provided on the lower glass plate 16 of the liquid crystal panel. In FIG. 10, reference numeral 26 denotes a TCP upper line; and 13 denotes the line in the chip.

Figure 25:
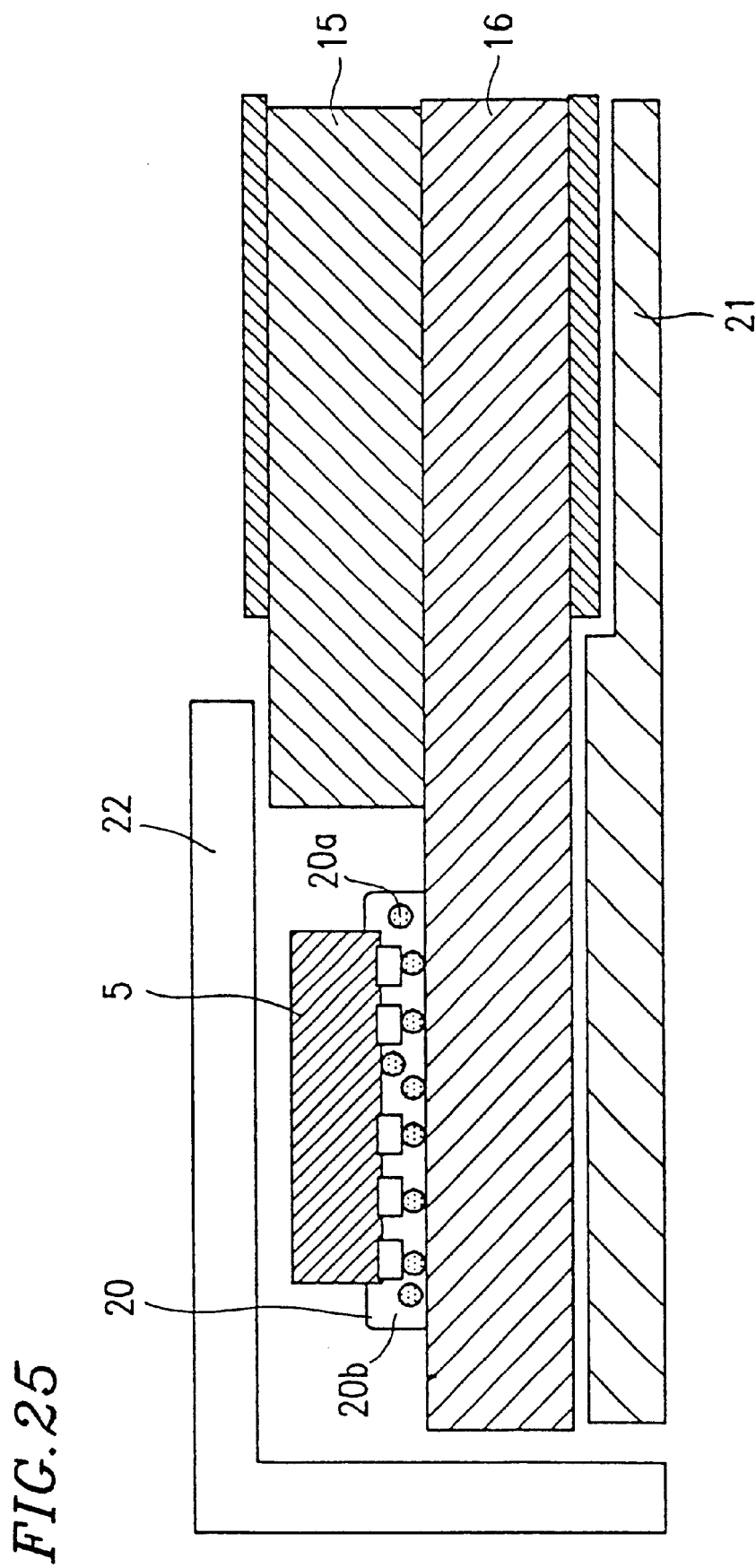
FIG. 25 is a cross-sectional view illustrating a peripheral portion of a liquid crystal display device obtained by the conventional ACF-COG method.
Figure 26A:
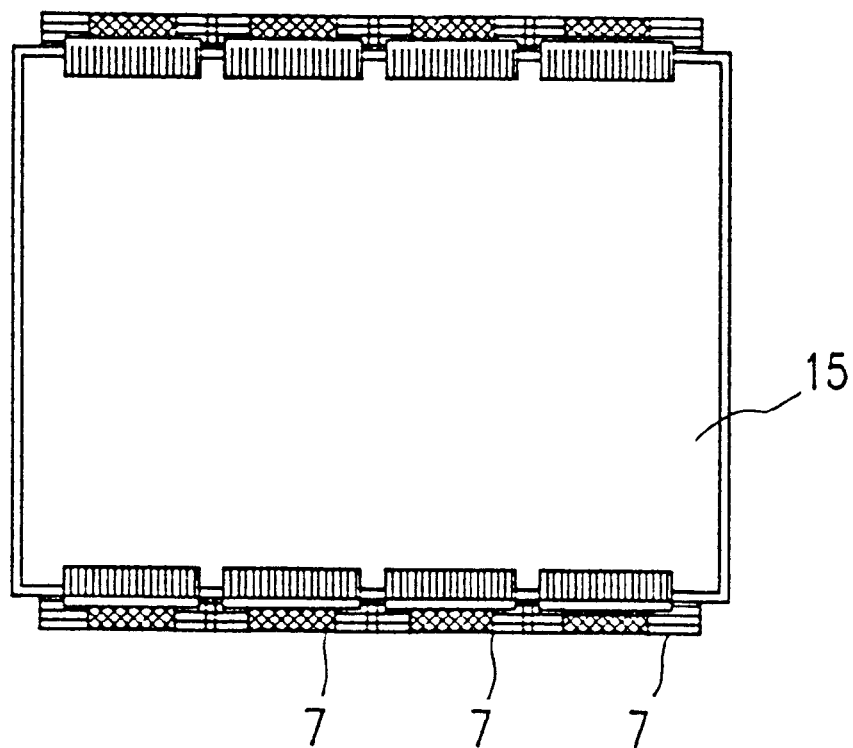
FIG. 26A is a plan view illustrating a conventional method for mounting TCPs so that adjoining TCPs are directly connected to each other.
Figure 26B:
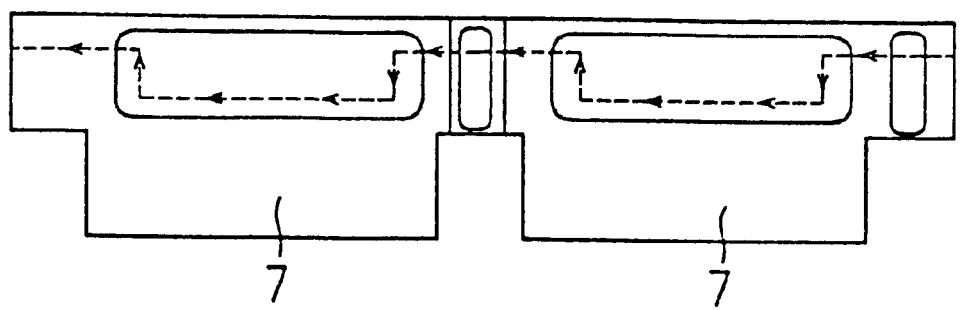
FIG. 26B is an enlarged plan view illustrating the TCP shown in FIG. 26A.
Figure 27:
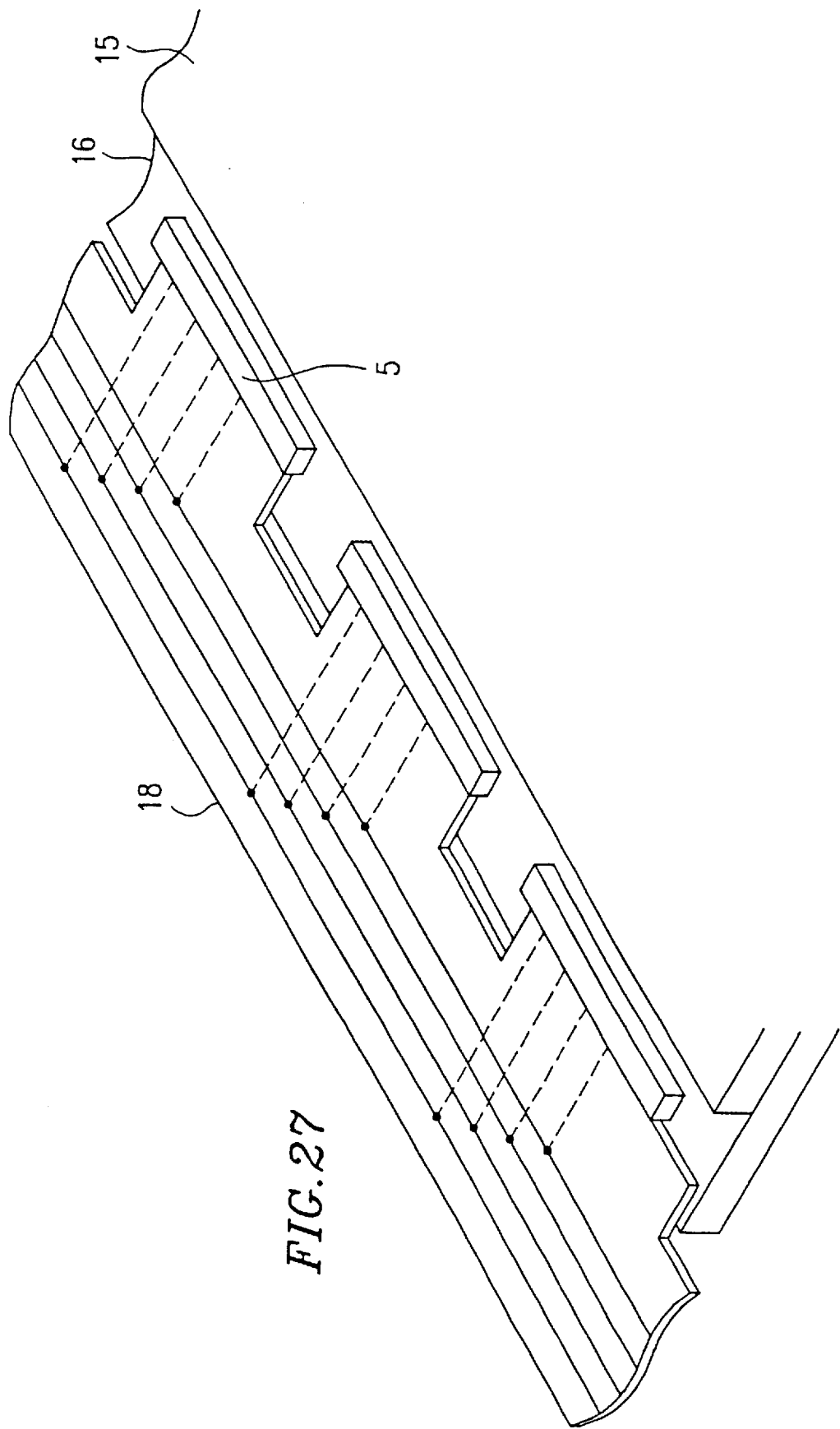
FIG. 27 is a perspective view illustrating a conventional liquid crystal display device produced based on the COG method in which input signals are supplied through a flexible wiring board.

Next, a comparison is made, based on calculations, between the input wiring resistance observed in the present example and that in the conventional ACF-COG method shown in FIG. 25, where all the input lines are provided by the lines on the glass plate. An 11.3-inch SVGA simple matrix type liquid crystal panel is assumedly used in the present example for the test calculation. In this case, 10 liquid crystal driving TCPs having 240 outputs are mounted on each side of the liquid crystal panel, whereby the number of input signal lines for each TCP is about 20.

Assuming the length of the TCP-mounting section of the 11.3-inch liquid crystal panel is about 220 mm, the length of a single TCP over which components may be mounted is about 22 mm. Assuming the length of one TCP is about 21.5 mm, the average length of the wiring pattern 17 on the lower glass plate 16 is about 0.5 mm.

In the present invention, since the electrodes on the opposite sides of one semiconductor chip are connected to each other with the line of the TCP made of a copper foil, the length of the line will be about 23 mm, considering the bending. That is, in the present invention, the wiring length on one side of the liquid crystal panel is 23×10=230 mm for the line of the TCP made of a copper foil, and is 0.5×10=5 mm for the wiring pattern 17 provided on the lower glass plate 16. In the above, "×10" was used in the calculation, though there are only 9 intervals between TCPs, considering the line of a half length existing beyond each of the outermost TCPs. Moreover, there are 2×10=20 connections of the anisotropic conductive film 20 connecting between the line of the TCP made of a copper foil and the wiring pattern 17 provided on the lower glass plate 16.

On the other hand, when all the input lines are provided by the lines on the glass plate based on the conventional ACF-COG method shown in FIG. 25, what has to be considered is only the lines on the lower glass plate 16. The length thereof is about 220 mm, and the connection step via the anisotropic conductive film 20 is performed once.

Assuming that the specific resistance of copper is about $1.7 \times 10^{-6} \Omega$, the sheet resistance of the line on the glass plate is about $1 \, \Omega/\square$ ($\Omega/\square$ means the sheet resistance), the wiring width is about 1 mm, and the connection resistance of the anisotropic conductive film 20 is about $0.1 \, \Omega$/connection, then, the total wiring resistance on one side of the liquid crystal panel is about $220\Omega$ in accordance with the conventional ACF-COG method, and is about $17\Omega$ in accordance with the present invention. Thus, the present invention provides a great effect in reducing the wiring resistance over the conventional method.

Such an effect can be obtained with the TCP 7 according to any one of Examples 1 to 6. Moreover, with the TCP 7 according to any one of Examples 1 to 6, it is possible to significantly reduce the wire resistance as compared to the case where one end obtained by splitting the lead 11a is connected to an end of a line provided on the semiconductor chip while connecting the other end to the other end of the line provided on the semiconductor chip (i.e., where power is sent from the lead 11a to the end of the line provided on the semiconductor chip and also to the other end via a bypass). The reason is that, while the lead of the present invention is relatively thick (e.g., about 18 $\mu$m) which is formed by electrolysis (or by rolling, etc.), with the sheet resistance thereof being about 0.01 to $0.003\Omega$, the line provided on the semiconductor chip is relatively thick (e.g., about ~1 $\mu$m) formed by deposition, or the like, with the sheet resistance thereof being very large, i.e., about 0.1 to $0.5\Omega$.

Example 8

Figure 11:
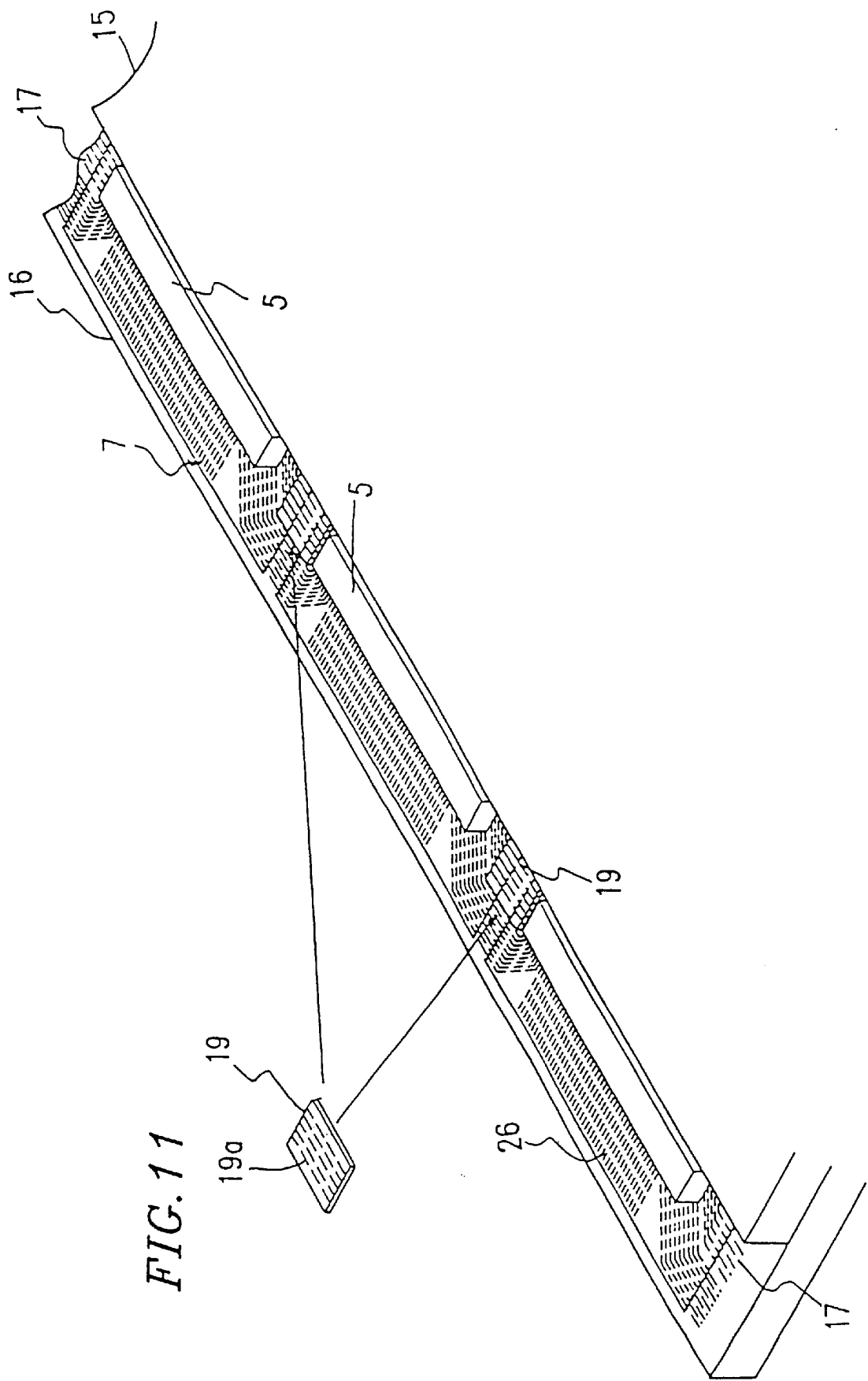
FIG. 11 is a perspective view illustrating a TCP mounting portion of a liquid crystal display device according to Example 8 of the present invention.

FIG. 11 is a perspective view illustrating a TCP mounting portion of a liquid crystal display device according to Example 8 of the present invention.

In the present example, particularly in a large panel which requires low wiring resistance, only a power source line is provided without using the lines on the lower glass plate, and the adjoining TCPs 7 are connected to each other via a line 19a formed on the TCP connection substrate 19. The wiring pattern 17 provided on the lower glass plate 16 is connected to the outermost TCPs 7. Note that reference numeral 26 denotes lines provided on the TCP.

In this case, the TCP connection substrate 19 is attached to a location between two TCPs on the lower glass plate 16 of the liquid crystal panel in a direction such that the patterned surface of the line 19a is exposed. Then, the TCP 7 is mounted according to the same procedure as in Example 7. In this method, when using a line having a sheet resistance of about 0.01Ω or less (as that used for the TCP of the present invention) as the lines of the TCP connection substrate 19, the wiring resistance is about 1Ω or less, thereby presenting an effect of preventing the wiring resistance from relatively increasing even when the size of the liquid crystal panel is further increased in the future.

Figure 12A:
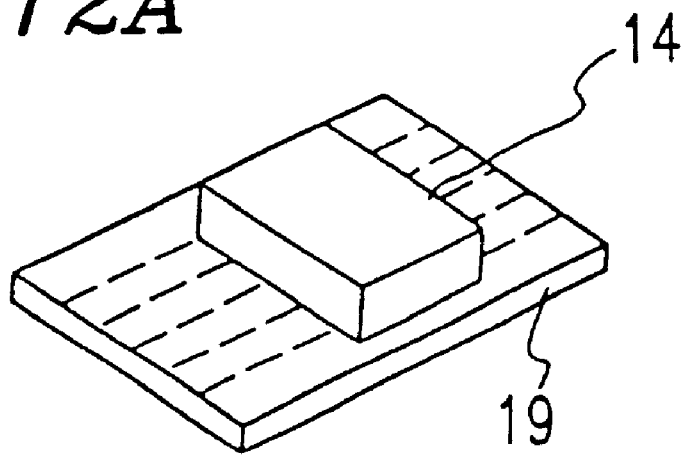
FIGS. 12A and 12B each illustrate a modification of the liquid crystal display device according to Example 8, where
Figure 12B:
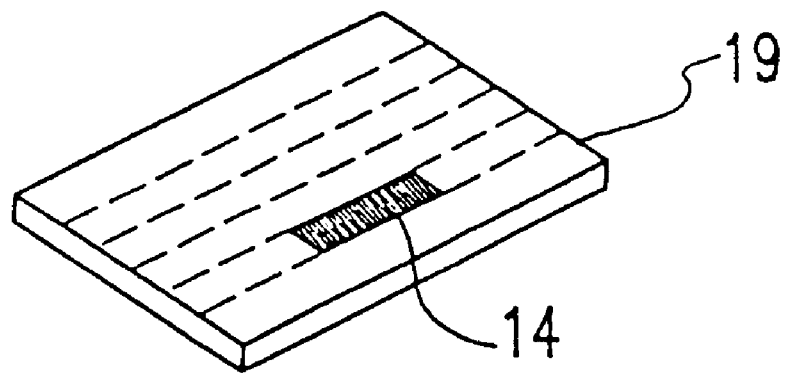

Moreover, the chip component (e.g., a chip capacitor) 14 may be mounted on the TCP connection, substrate 19, as shown in FIG. 12A, or in the TCP connection substrate 19, as shown in FIG. 12B. When mounting the chip component in the substrate, it is preferable, as shown in FIG. 12B, to use an LTCC (Low Temperature Cofired Ceramic) substrate as the substrate, and to form the chip component (e.g., a chip capacitor) 14 within or on the surface of the substrate by a method such as printing. In this way, the mounting cost can be suppressed while the design freedom can be increased.

In the above description, a liquid crystal display device has been described as an example. However, the present invention is not limited thereto, but may also be applied generally to other display devices which use a display medium other than a liquid crystal material.

Example 9

Figure 13:
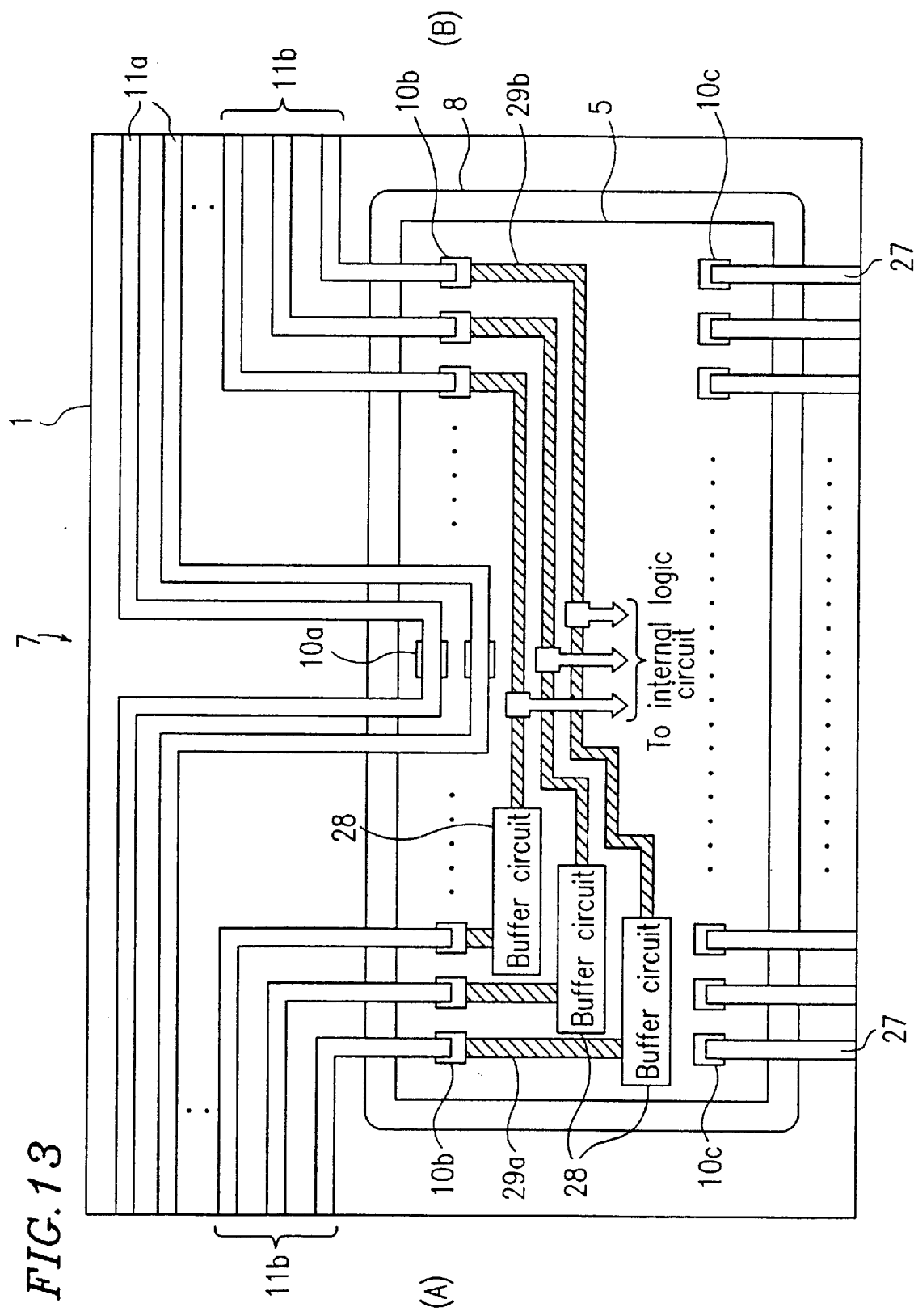
FIG. 13 is a plan view illustrating a TCP according to Example 9 of the present invention and a semiconductor chip mounted thereon.

FIG. 13 is a plan view illustrating a TCP according to Example 9 of the present invention and a semiconductor chip mounted thereon. It should be noted that the TCP portion can be realized by the TCP according to any one of the above-described examples.

First, the configuration and operation of the semiconductor chip 5 of FIG. 13 will be described. For purposes of discussion, it is assumed in the description below that a signal input to the semiconductor chip 5 is supplied from the side indicated at (A) in FIG. 13 via a controller, or another semiconductor chip, ITO lines, or the like. The signal is output from the other side indicated at (B) in FIG. 13. Then, the output signal is supplied to another semiconductor chip provided on another TCP 7 via the ITO lines on the glass plate.

The signal input via the terminal 11b is provided to the bump 10b on the semiconductor chip 5 via the inner lead line on the TCP 7. The bump 10b is electrically connected to a line 29a of an aluminum line, or the like, provided in the semiconductor chip 5, which is connected to a buffer circuit 28. The buffer circuit 28 shapes the waveform of the input signal, and drives a transistor connected to an internal logic circuit (not shown) with the input signal whose waveform is shaped. The signal is output through the terminal 11b on the side (B) via the line 29a, the bump 10b, and the inner lead line on the TCP 7. The signal is then supplied to the next semiconductor chip.

The line 29a can be designed with a wiring width determined in view of the discharge and charge current to the transistor of the buffer circuit 28 moreover, the line 29a can be designed with a wiring width determined in view of the discharge and charge current to the transistor connected to the internal logic circuit and the transistor of the buffer circuit of the next semiconductor chip and the connection load of the ITO line, and the like. Thus, as compared to the width of a line designed in view of all of the semiconductor chips to be connected and the connection load of the ITO line, and the like, the width can be considerably reduced, and the chip area can also be reduced. Furthermore, since the waveform of a signal is shaped at each semiconductor chip 5 by the buffer circuit 28 thereof, the signal can be sent normally without being influenced by the transistors to be driven and the ITO connection wiring load, and the like, whereby a malfunctioning can be prevented, while the influence of the noise can be suppressed.

On the other hand, the signal having passed though the transistor connected to the internal logic circuit goes through various logic circuits and is output through the output terminal so as to drive the display medium in the display device. These circuits will not be further described for sake of brevity.

Figure 14:
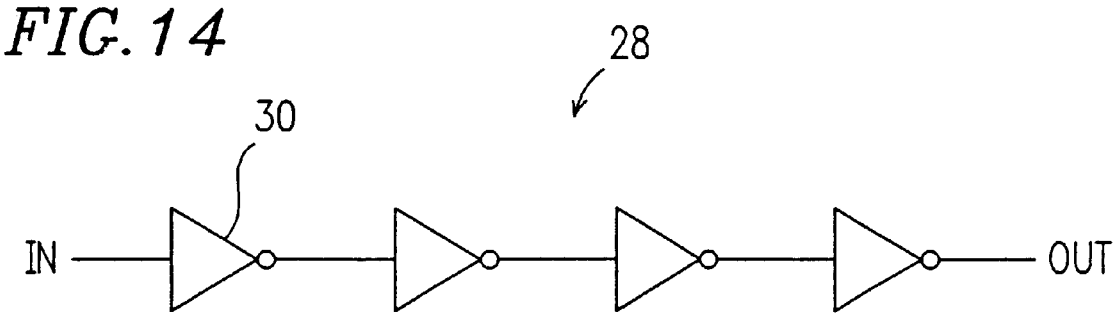
FIG. 14 shows an example of a logic circuit diagram of the buffer circuit shown in FIG. 13.

Next, FIG. 14 shows an example of the buffer circuit 28 shown in FIG. 13. Although the buffer circuit 28 is formed by four inverter circuits 30 in FIG. 14, the number of inverter circuits 30 included in the buffer circuit 28 may also be two, six, or any other multiple of 2. Moreover, other circuit configurations are also possible: e.g., the first inverter circuit 30 may be a Schmitt circuit or an input comparator circuit.

Figure 15:
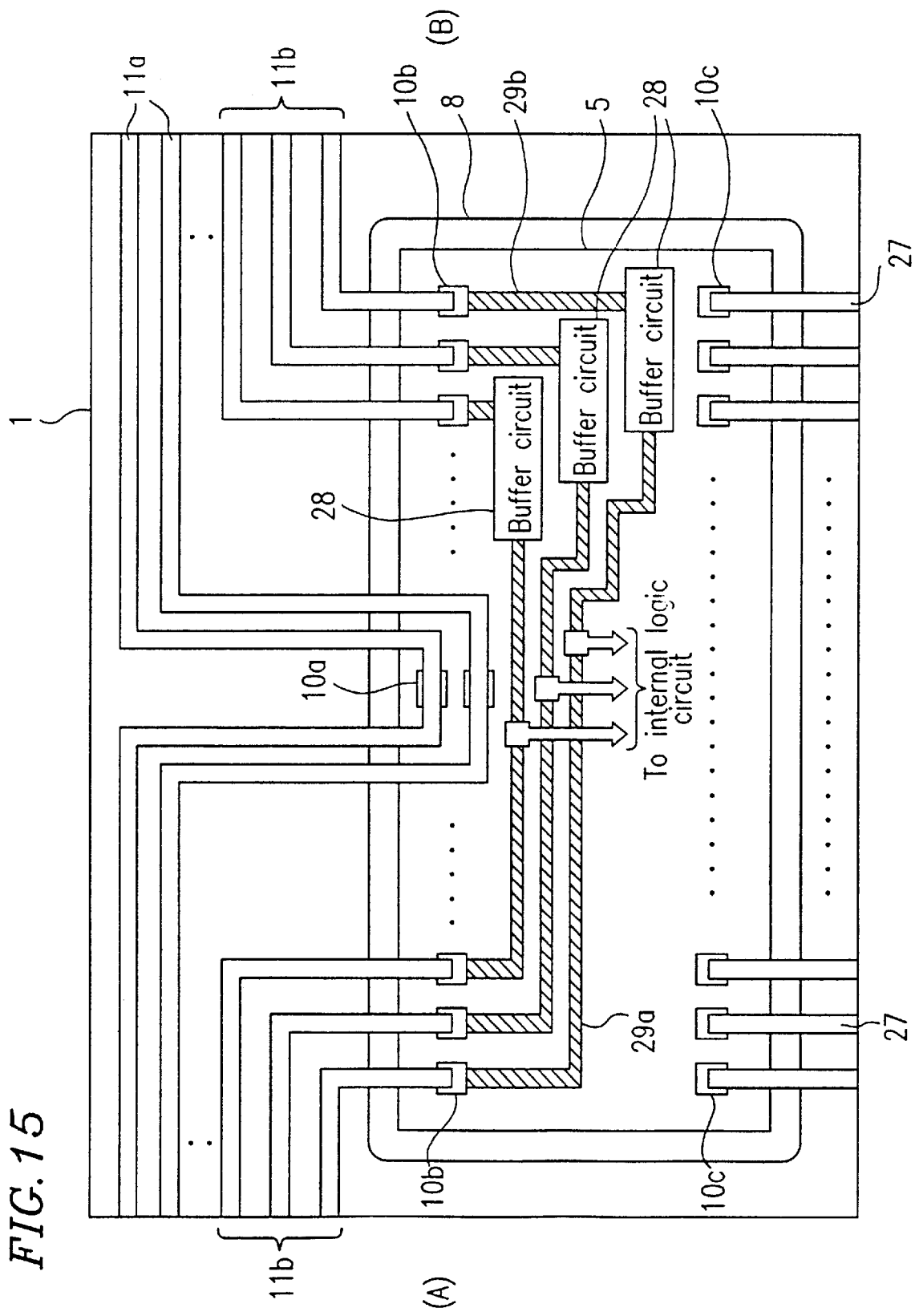
FIG. 15 is a plan view illustrating a TCP where the positions of the buffer circuits have been changed from those in FIG. 13 and a semiconductor chip mounted thereon.

FIG. 15 shows an alternative configuration where the positions of the buffer circuits 28 are changed from those in FIG. 13. Even when the positions of the buffer circuits 28 are changed, similar effects as described above can be achieved.

Example 10

Figure 16:
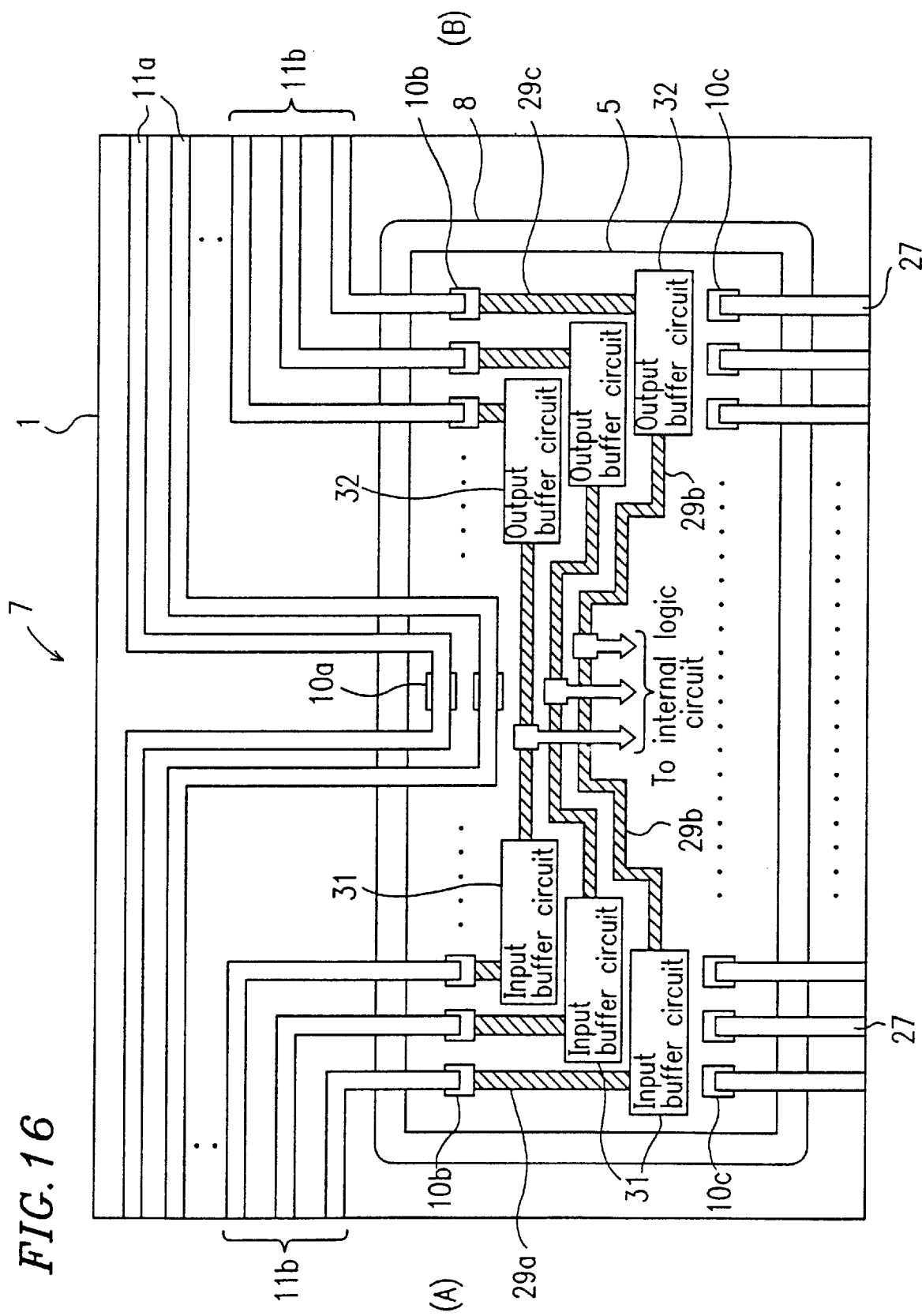
FIG. 16 is a plan view illustrating a TCP according to Example 10 of the present invention and a semiconductor chip mounted thereon.

FIG. 16 is a plan view illustrating a TCP according to Example 10 of the present invention and a semiconductor chip mounted thereon. It should be noted that the TCP portion can be realized by the TCP according to any one of the above-described examples.

In FIG. 16, each buffer circuit in the semiconductor chip 5 in the example described with reference to FIG. 13 is divided into an input buffer circuit 31 and an output buffer circuit 32, with the buffer circuits 31 and 32 being connected to each other by one of the lines 29a, 29b and 29c of an aluminum line, or the like, provided in the semiconductor chip 5. Moreover, each line 29 connecting the buffer circuits 31 and 32 together is connected to a transistor connected to the internal logic circuit.

The operation of the TCP 7 will be described. As described above in Example 9, an input signal input from the terminal 11b on the side (A) drives the input buffer circuit 31 via the inner lead line on the TCP 7, the bump 10b, the line 29a of an aluminum line, or the like, provided in the semiconductor chip 5. The input buffer circuit 31 then drives the output buffer circuit 32 connected thereto via the line 29b and the transistor connected to the internal logic circuit. Moreover, past the output buffer circuit 32, the signal is output through the terminal 11b on the side (B) via the inner lead line on the line 29c, the bump 10b and the inner lead line on the TCP 7. Then, the signal drives the next semiconductor chip.

As in Example 9, the above description is based on the assumption that a signal is input from the side (A) and output from the side (B). However, in practice, a signal may also be input from the side (B) and output from the side (A). When a signal is input from the side (B) and output from the side (A), the position of the input buffer circuit 31 and the position of the output buffer circuit 32 as in FIG. 16 are switched. The line 29a of an aluminum line, or the like, provided in the semiconductor chip 5 can be designed with a width determined in view of the discharge and charge current to the transistor of the input buffer circuit 31; the line 29b of an aluminum line, or the like, can be designed with a width determined in view of the discharge and charge current to the transistor connected to the internal logic circuit and the transistor of the buffer circuit 32; and the line 29c of an aluminum line, or the like, can be designed with a width determined in view of the ITO connection wiring load and the discharge and charge current to the transistor of the input buffer circuit of the next semiconductor chip.

The width of each of the lines 29a, 29b and 29c can be made smaller than that when all the semiconductor chips are connected to one another by the lines in the semiconductor chip. Moreover, since the line 29b is not connected to the outside of the semiconductor chip 5, and the load generated when being driven is small, the wiring width thereof can be made even smaller, while it is not influenced by an external noise. Furthermore, by locating the input buffer circuit 31 and the output buffer circuit 32 closer to the bumps 10b to which the buffer circuits 31 and 32 are connected by the lines 29a and 29c, respectively, the lines 29a and 29c between the bumps 10b and the buffer circuits 31 and 32 can be shortened, whereby the influence of an external noise can be further suppressed, and the wiring region in the semiconductor chip 5 can be reduced. The input buffer circuit 31 and the output buffer circuit 32 provide similar function and effect as those of the buffer circuit described in Example 9.

Figure 17A:
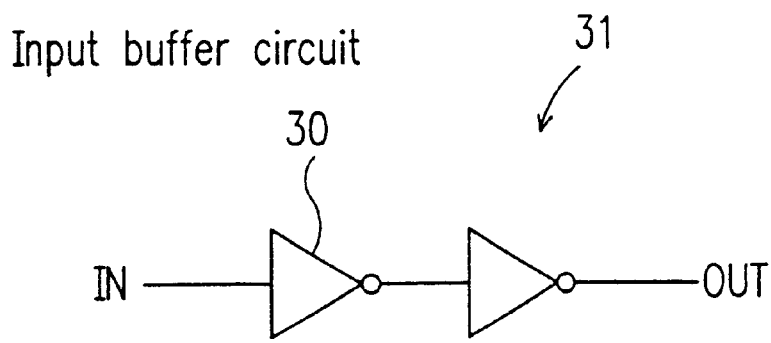
FIG. 17A shows an example of a logic circuit diagram of the input buffer circuit shown in FIG. 16.
Figure 17B:
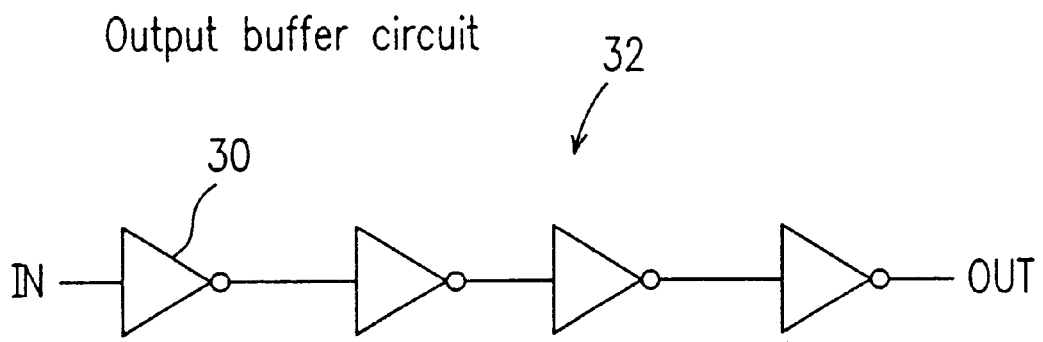
FIG. 17B shows an example of a logic circuit diagram of the output buffer circuit shown in FIG. 16.

FIG. 17A shows an example of a logic circuit diagram of the input buffer circuit 31 shown in FIG. 16; and FIG. 17B shows an example of a logic circuit diagram of the output buffer circuit 32 shown in FIG. 16. In FIG. 17A, the input buffer circuit 31 is formed by two inverter circuits 30. In FIG. 17B, the output buffer circuit 32 is formed by four inverter circuits 30. However, the number of inverter circuits 30 included in the input buffer circuit 31 and those included in the output buffer circuit 32 may be changed so that the total number of the inverter circuits 30 used is a multiple of 2. For example, it is applicable to form the input buffer circuit 31 by one inverter circuit 30, while forming the output circuit 32 by three inverter circuits 30. Moreover, each of the first inverter circuit 30 in the input buffer circuit 31 and the first inverter circuit 30 in the output buffer circuit 32 may also be a Schmitt circuit or an input comparator circuit. Any other circuit configuration which would provide similar effects as described above may also be employed.

Example 11

Figure 18:
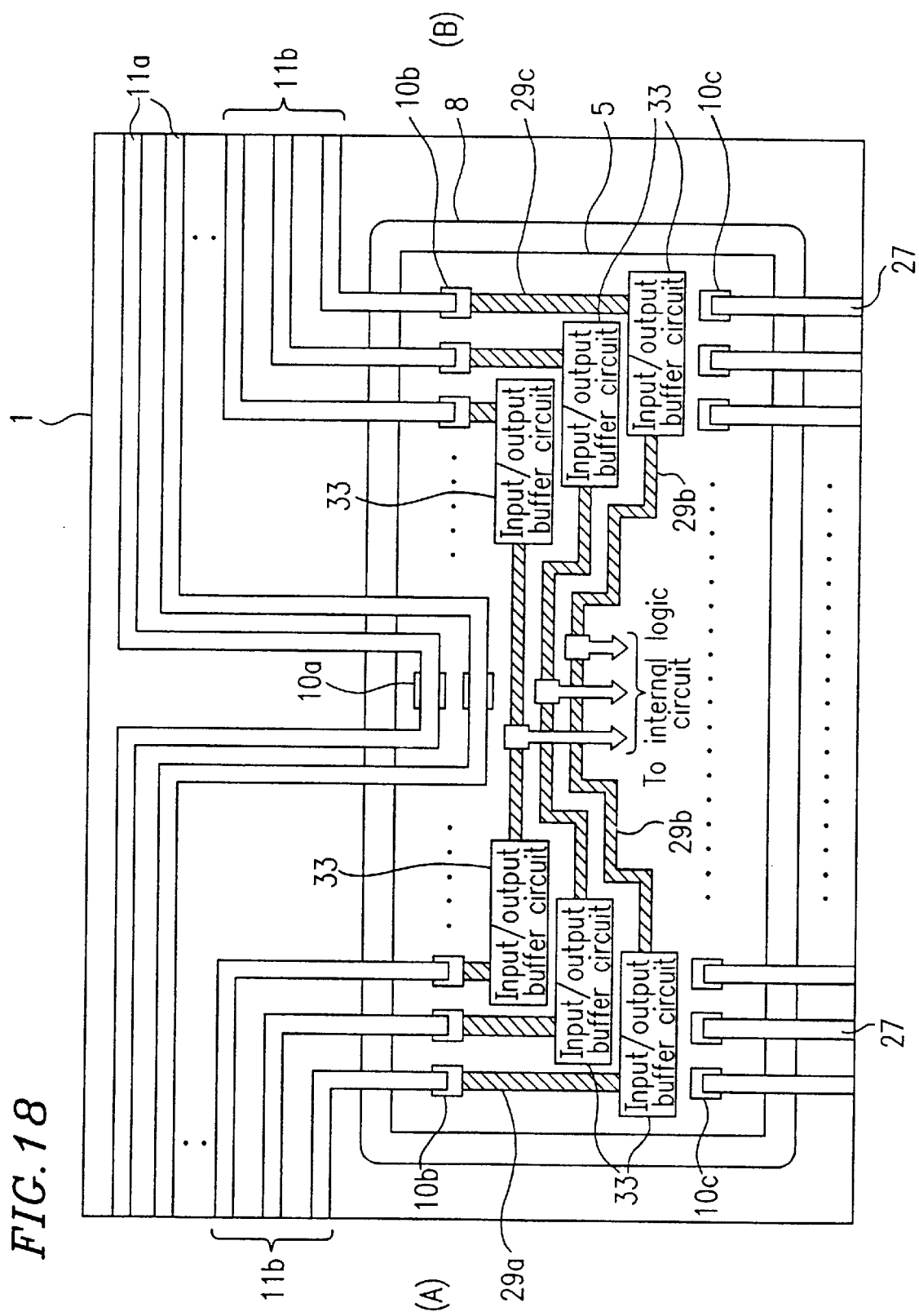
FIG. 18 is a plan view illustrating a TCP according to Example 11 of the present invention and a semiconductor chip mounted thereon.

FIG. 18 is a plan view illustrating an important part of a TCP according to Example 11 of the present invention and a semiconductor chip mounted thereon. It should be noted that the TCP portion can be realized by the TCP according to any one of the above-described examples.

In the configuration shown in FIG. 18, the input buffer circuit 31 and the output buffer circuit 32 described with reference to FIG. 16 are each replaced with an input/output buffer circuit 33. When one of a pair of input/output buffer circuits 33 functions as an input buffer circuit, according to the direction in which a signal is input, the other functions as an output buffer circuit. It is also possible to, externally from the outside of the semiconductor chip 5, set the input/output buffer circuit 33 to be either an input buffer circuit or an output buffer circuit, depending upon the direction in which a signal is input. Moreover, when the direction in which a signal is input is fixed, a direction selection signal can be fixed to a certain power level within the semiconductor chip 5 or on the TCP 7. The other features, e.g., the operation, of the present example are the same as in Example 10, and will not be further described below for sake of brevity.

Figure 19:
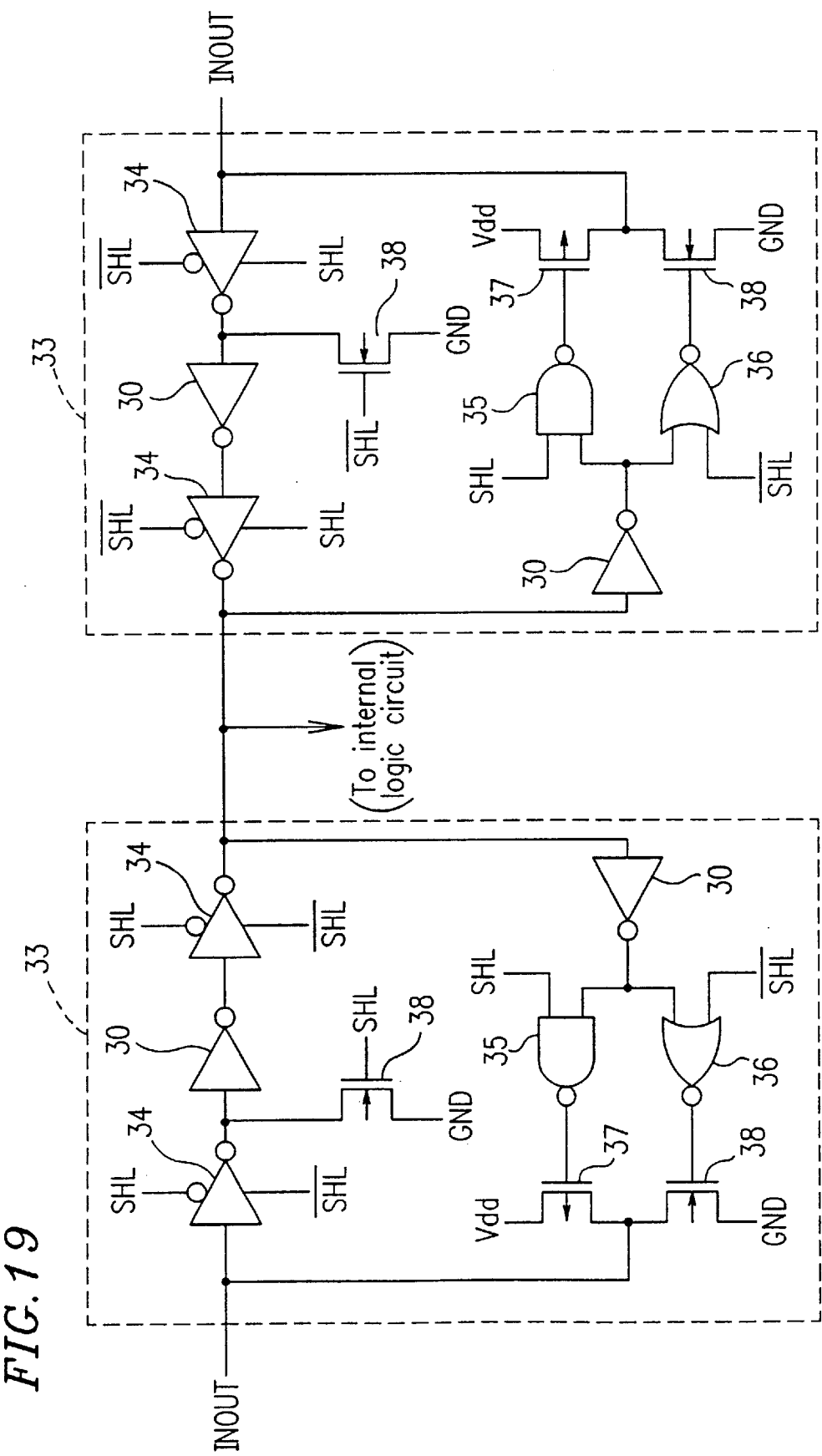
FIG. 19 shows an example of a logic circuit diagram of the input/output buffer circuit shown in FIG. 18.

FIG. 19 shows an example of the input/output buffer circuit 33 shown in FIG. 18. Referring to FIG. 19, when one half of the circuit is determined to function as an input buffer circuit, based on a direction selection signal SHL, the other half of the circuit will function as an output buffer circuit. In FIG. 19, reference numeral 30 denotes an inverter circuit; 34 denotes a clocked inverter circuit; 35 denotes an NAND circuit; 36 denotes an NOR circuit; 37 denotes a PMOS transistor; and 38 denotes an NMOS transistor. Moreover, the number of transistors to be provided in one input/output buffer circuit 33 may be changed, and it is also applicable to employ a Schmitt circuit or an input comparator circuit for some of the input/output buffer circuits 33. Description of the number of transistors to be provided has already been provided in Example 10, and will not be further provided.

Figure 20:
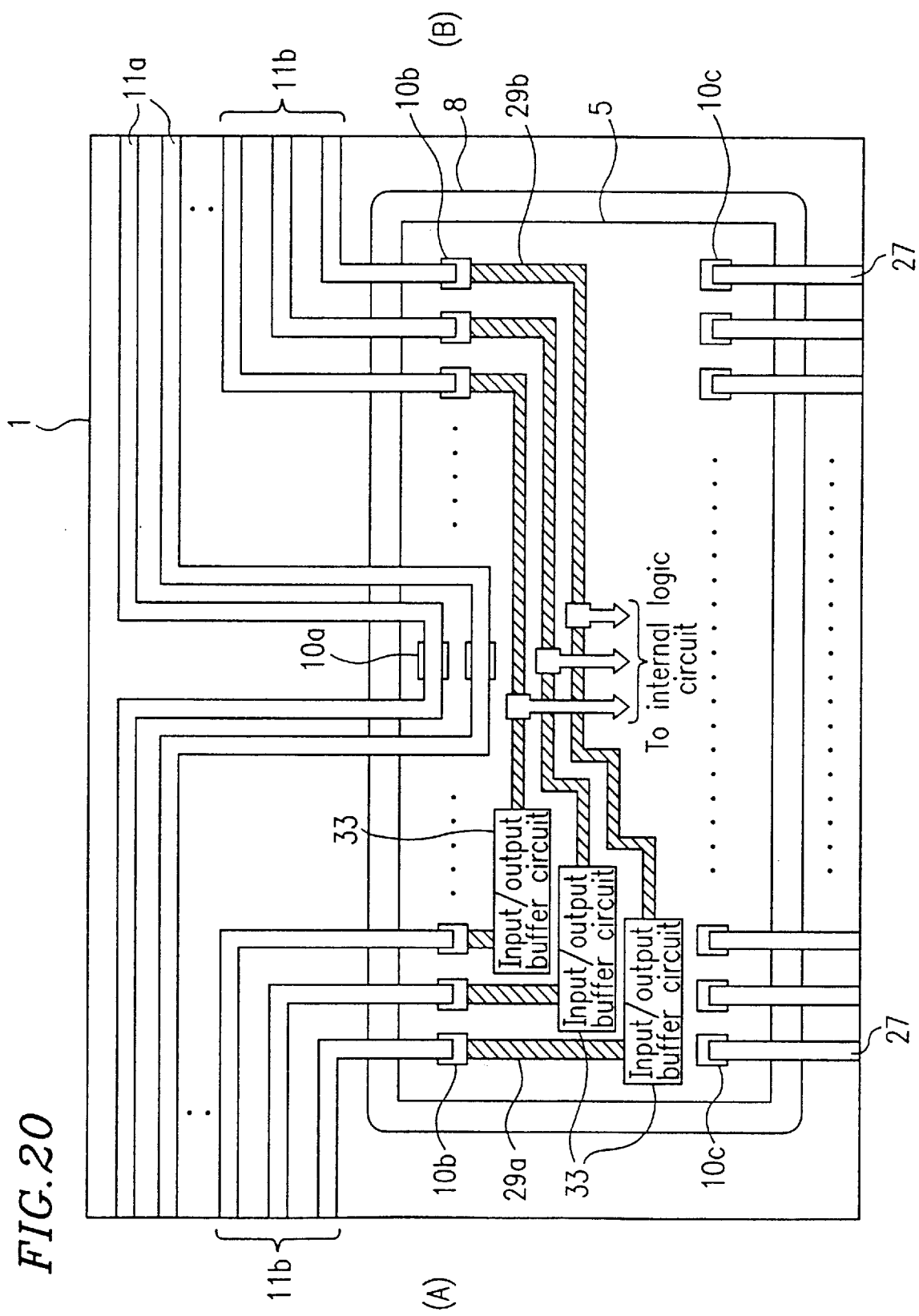
FIG. 20 is a plan view illustrating another TCP according to Example 11 of the present invention and a semiconductor chip mounted thereon.
Figure 21:
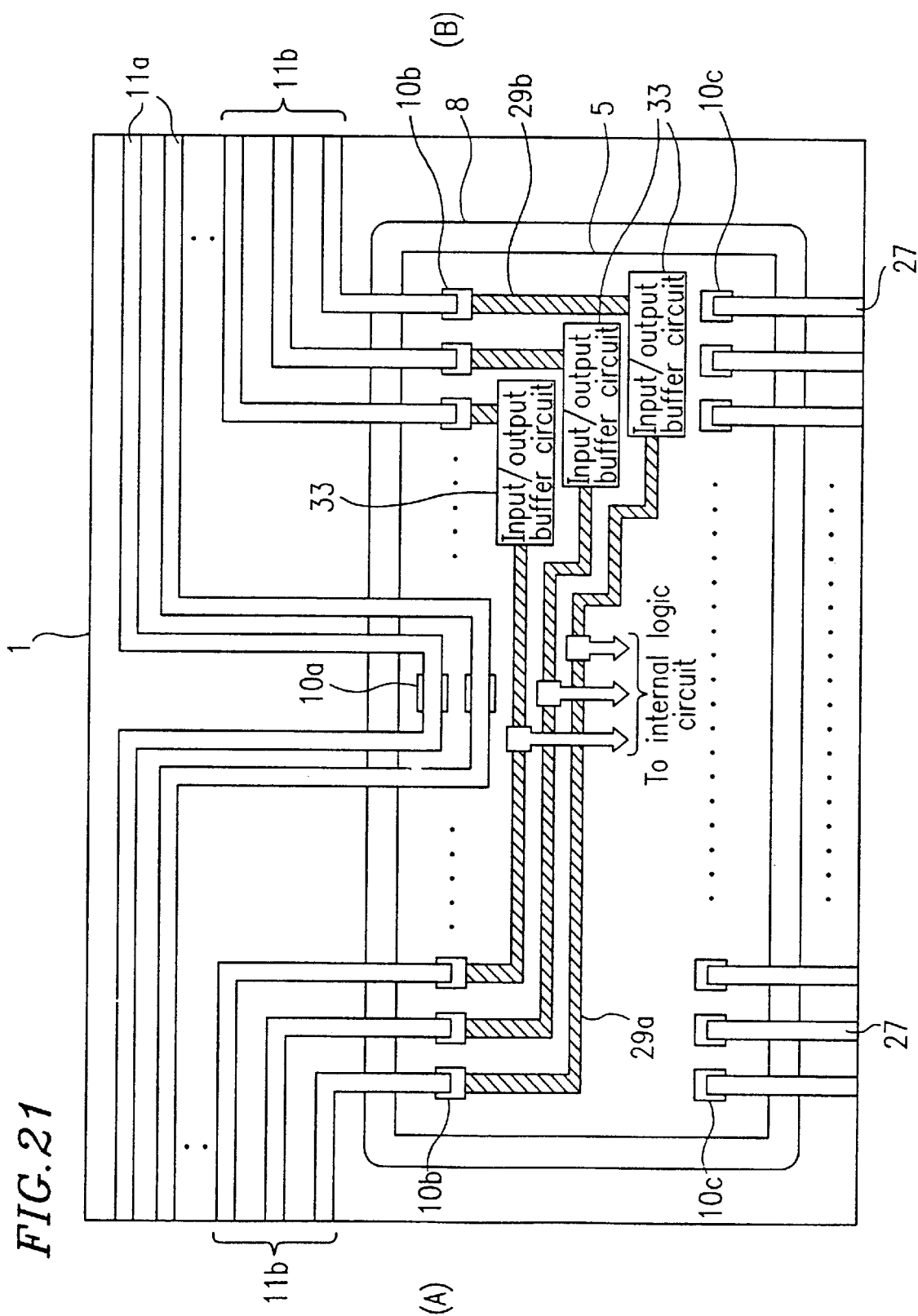
FIG. 21 is a plan view illustrating still another TCP according to Example 11 of the present invention and a semiconductor chip mounted thereon.

FIGS. 20 and 21 are each a plan view illustrating an important part of another TCP according to Example 11 of the present invention and a semiconductor chip mounted thereon. It should be noted that the TCP portion can be realized by the TCP according to any one of the above-described examples.

In FIG. 20, the buffer circuit 28 described with reference to FIG. 13 is replaced with the input/output buffer circuits 33. In FIG. 21, the buffer circuit 28 described with reference to FIG. 15 is replaced with the input/output buffer circuits 33. The other features, e.g., the operation, are the same as in Example 9, and will not be further described below.

Figure 22:
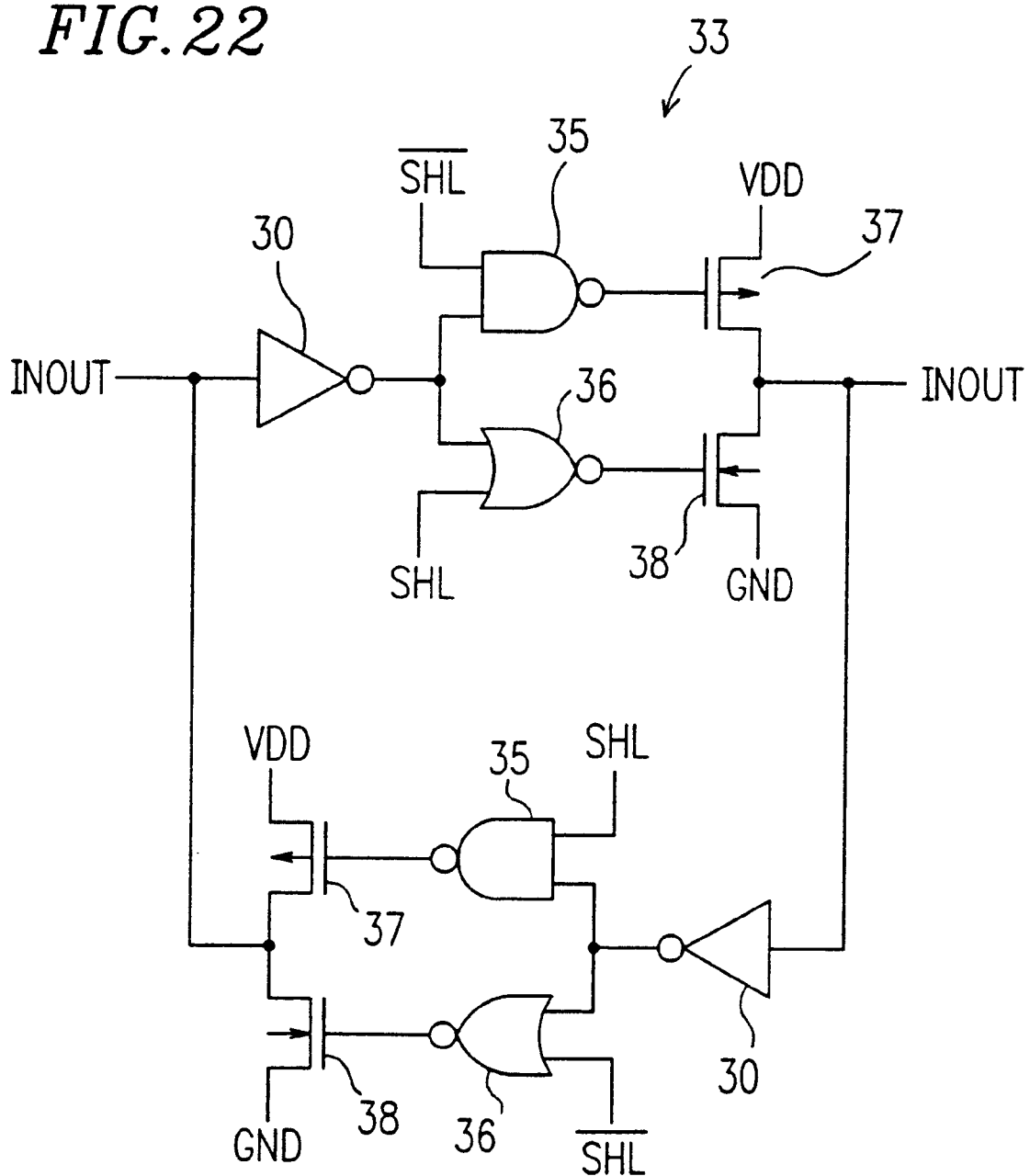
FIG. 22 shows an example of a logic circuit diagram of the input/output buffer circuit shown in FIGS. 20 and 21.
Figure 23:
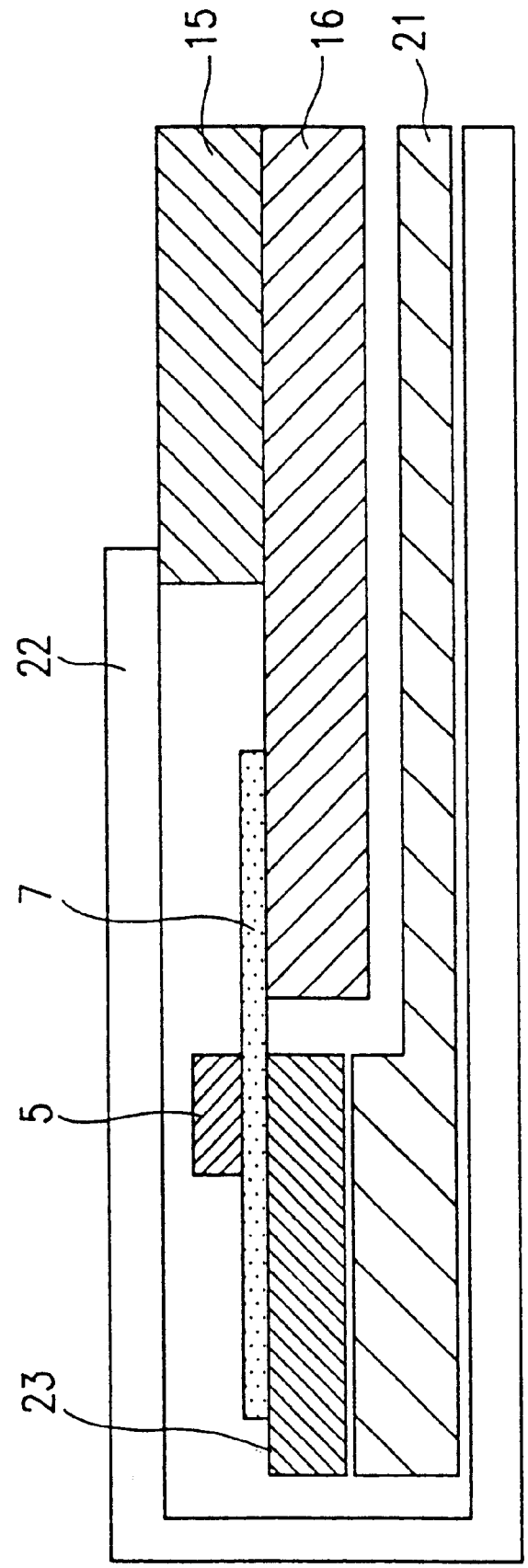
FIG. 23 is a cross-sectional view illustrating a peripheral portion of a liquid crystal display device obtained by a conventional flat mounting method.
Figure 24:
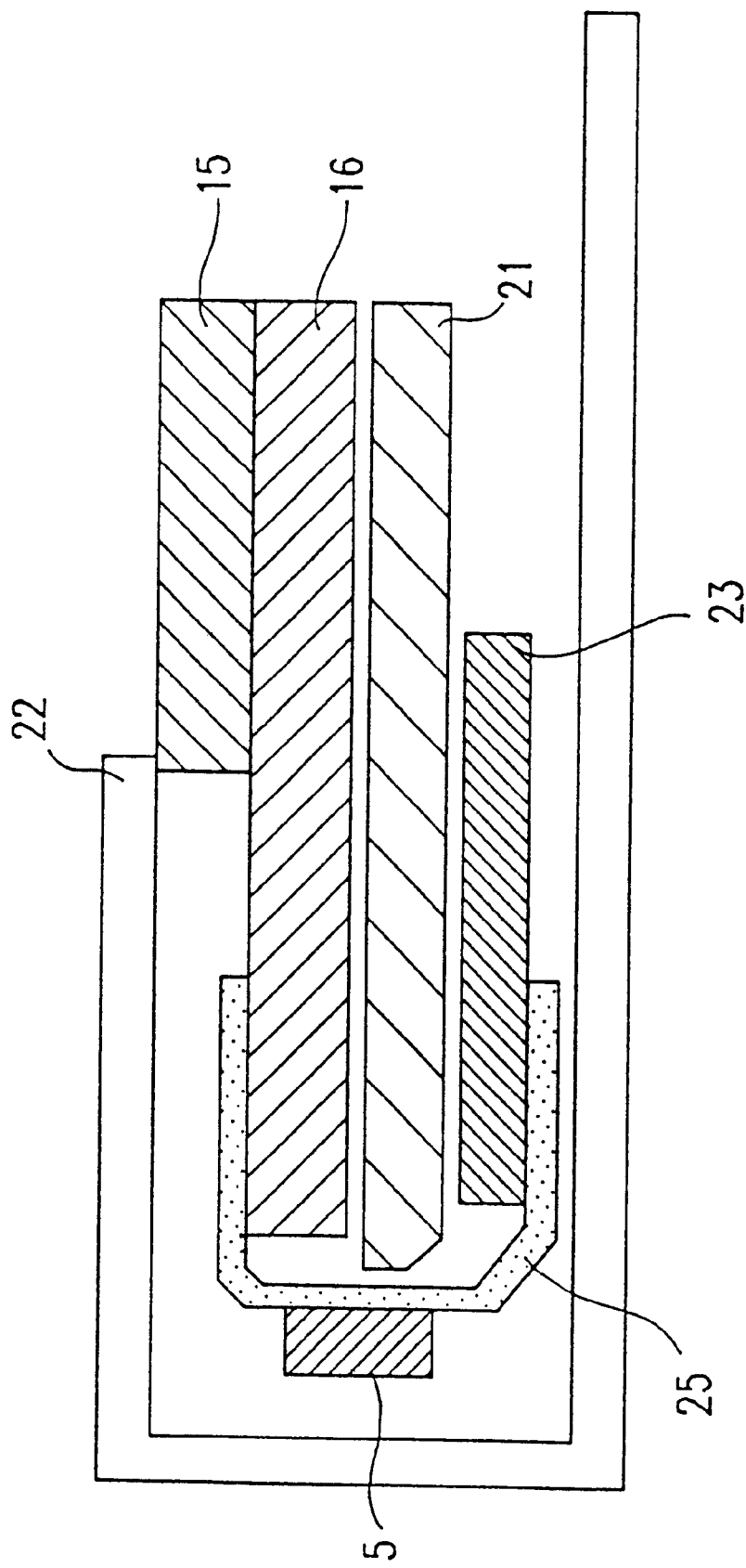
FIG. 24 is cross-sectional view illustrating a peripheral portion of a liquid crystal display device obtained by the conventional bending mounting method.

FIG. 22 shows an example of the input/output buffer circuits 33 shown in FIGS. 20 and 21. As described above, in the circuit shown in FIG. 22, the number of transistors to be provided in one input/output buffer circuit 33 may be changed, and it is also applicable to employ a Schmitt circuit or an input comparator circuit for some of the input/output buffer circuits 33. Other circuit configurations may also be applicable.

For example, an STN liquid crystal panel, when it is a large panel, is driven based on a dual screen driving method, where one display screen is divided into two (e.g., upper and lower) screens in view of the display quality thereof by employing the above-described configuration of Example 11. In such a case, the direction in which a signal is input is reversed between the semiconductor chip used for the upper half and the semiconductor chip used for the lower half. However, if the direction in which a signal is input can be set externally, a single semiconductor chip can be shared. Moreover, it is not necessary to develop a semiconductor chip for each of the directions of signal input, whereby it is possible to improve the development efficiency and to facilitate the developmental management.

As described in detail above, in the TCP of the present invention, the input terminals for the lines are provided on the side perpendicular to the side on which the output terminal is provided, whereby it is possible to ensure the quality of the semiconductor chip, i.e., to determine whether it is good or bad, by performing a test using the input terminal.

Moreover, in the display device of the present invention, the TCP including the input terminals is mounted on the display panel, where electrical connection between adjoining TCPs is achieved by the lines provided on the display panel. Therefore, it is possible to reduce the number of connection steps to be performed to ⅓ of that in the conventional tequnique, since the connection of the input/output terminals can be done in a single step of mounting the TCP. Moreover, according to the present invention, only a defective TCP needs to be removed from the glass plate, and only the surface of the glass plate has to be washed, whereby a repair process can be achieved with half the work of the conventional technique. Furthermore, a portion of the TCP extending beyond the glass plate can be bent when mounting a bezel, and the like, whereby the frame size can also be reduced. Since a printed board with a large linear expansion coefficient is not used, the reliability against the temperature variation is improved as compared to the conventional technique. Moreover, the mechanical reliability against vibration, or the like, can also be increased to a level comparable to that in the COG method, since there is no movable section or no section to be oscillated as the TCP or the printed wiring board in the conventional TCP method.

Furthermore, in the conventional method, a large stress is applied to the TCP connection due to the difference in linear expansion coefficient between the printed board and the glass plate, thereby increasing the possibility for pattern breaks to occur. However, according to the present invention, since the printed board is not used, such a stress is not created, whereby the mounting process can be safely performed to a large panel.

Furthermore, since the semiconductor chip of the present invention includes a buffer circuit provided therein, the semiconductor chip area can be reduced, whereby it is possible to reduce the cost and to increase the reliability. The influence of a noise can also be suppressed, and even signals which requires a fast operation such as a clock signal can be reliably transmitted in a normal manner, whereby it is possible to prevent the semiconductor chip from malfunctioning.

Furthermore, by employing an input/output buffer circuit as a buffer circuit, it becomes possible to freely and externally alter the signal transmission direction, whereby the semiconductor chip can be shared.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A tape carrier package comprising:
   a line provided on one surface of a tape substrate: and
   a semiconductor chip mounted on another surface of the tape substrate, the semiconductor chip having an electrode which is electrically connected to the line, wherein:
   the line extends from one end to an opposite end of the tape substrate and includes a connection where an intermediate line portion provided in a middle between the ends is electrically connected to the electrode, the line extending outwardly in at least two directions at the connection between a portion of the line and the electrode within the intermediate line portion, wherein:
   the intermediate line portion including the connection is formed to extend in a U shape over a device hole provided in the tape substrate; and
   the connection is in a portion substantially overhanging the device hole and is electrically connected to the electrode of the semiconductor chip substantially at the overhanging portion.

2. A tape carrier package according to claim 1, wherein there are a plurality of the lines provided on the one surface of the tape substrate.

3. A tape carrier package according to claim 2, wherein a portion of the line disposed at an most-inner side of the lines is in a I shape.

4. A tape carrier package according to claim 1, wherein:
   the device hole is formed separately from other openings formed in the tape substrate; and
   the intermediate line portion is provided to run substantially linearly at the device hole.

5. A tape carrier package according to claim 1, wherein:
   the line is for a power source; and
   the tape substrate is further provided with a signal line to be electrically connected to an electrode of the semiconductor chip.

6. A tape carrier package according to claim 1, wherein:
   a plurality of lines are provided on the tape substrate; and
   an electronic component different from the semiconductor chip is connected and mounted between the lines.

7. A tape carrier package according to claim 1, wherein the semiconductor chip includes a buffer circuit for signal connection between the semiconductor chip and a semiconductor chip provided on another tape carrier package.

8. A tape carrier package according to claim 7, wherein the buffer circuit included in the semiconductor chip comprises an input buffer circuit and an output buffer circuit.

9. A tape carrier package according to claim 7, wherein the buffer circuit included in the semiconductor chip comprises an input/output buffer circuit.

10. A display device, wherein:
    tape carrier package according to claim 1 is provided on a glass plate of a display panel; and
    adjoining ones of the tape carrier packages are electrically connected to one another via a line provided on the glass plate.

11. A display device according to claim 10, wherein the connection between the line provided on the glass plate and the tape carrier package comprises an anisotropic conductive film.

12. A display device according to claim 10, wherein the line provided on the glass plate is formed directly on the glass plate.

13. A display device according to claim 12, wherein an electronic component different from the semiconductor chip is connected and mounted onto the line provided on the glass plate.

14. A display device according to claim 10, wherein the display panel is a liquid crystal panel.

15. A display device according to claim 10, wherein the line provided on the glass plate is a line formed on a substrate other than the glass plate.

16. A display device according to claim 15, wherein an electronic component different from the semiconductor chip is connected and mounted onto the line provided on the glass plate.

17. A tape carrier package comprising:
    a line provided on one surface of a tape substrate: and
    a semiconductor chip mounted on another surface of the tape substrate, the semiconductor chip having an electrode which is electrically connected to the line, wherein:
    the line extends from one end to an opposite end of the tape substrate and includes a connection where an intermediate line portion provided in a middle between the ends is electrically connected to the electrode, the line extending outwardly in at least two directions at the connection between a portion of the line and the electrode within the intermediate line portion, wherein:

the intermediate line portion including the connection is bent in a V shape toward the device hole;

the connection is in a portion substantially overhanging the device hole and is electrically connected to the electrode of the semiconductor chip substantially at the overhanging portion; and a portion of the intermediate line portion which extends substantially at the device hole is linearly shaped.

18. A tape carrier package according to claim 17, wherein the device hole is provided as a notch substantially at a location over which the linearly-shaped intermediate line portion extends.

19. A tape carrier package according to claim 4, wherein the linearly-shaped intermediate line portion which extends substantially at the notch is provided with a bent buffering portion.

20. A tape carrier package comprising:

a conductive line provided on one surface of a tape substrate and extending from one end of the tape substrate to another end of the tape substrate; and a semiconductor chip mounted on another surface of the tape substrate, the semiconductor chip having an electrode that is electrically connected to the conductive line, wherein:

the conductive line includes a connection at an intermediate portion provided in a middle between the ends of the conductive line, the connection being electrically connected to said electrode, and the line extending outwardly in at least two directions at the connection between a portion of the line and the electrode within the intermediate line portion, wherein:

the intermediate line portion including the connection is formed to extend in a U shape over a device hole provided in the tape substrate; and the connection is in a portion substantially overhanging the device hole and is electrically connected to the electrode of the semiconductor chip substantially at the overhanging portion.

21. A tape carrier package comprising:

a conductive line provided on one surface of a tape substrate and extending from one end of the tape substrate to another end of the tape substrate; and a semiconductor chip mounted on another surface of the tape substrate, the semiconductor chip having an electrode that is electrically connected to the conductive line, wherein:

the conductive line includes a connection at an intermediate portion provided between the ends of the conductive line, the connection being electrically connected to said electrode, and the line extending outwardly in at least two directions at the connection between a portion of the line and the electrode within the intermediate line portion, wherein:

the intermediate line portion including the connection is formed to extend in a U shape over a device hole provided in the tape substrate; and the connection is in a portion substantially overhanging the device hole and is electrically connected to the electrode of the semiconductor chip substantially at the overhanging portion.

* * * * *